US010211210B2

(12) United States Patent
Ma et al.

(10) Patent No.: US 10,211,210 B2
(45) Date of Patent: Feb. 19, 2019

(54) METHODS OF FABRICATING SEMICONDUCTOR DEVICES

(71) Applicant: Samsung Electronics Co., Ltd., Suwon-si, Gyeonggi-do (KR)

(72) Inventors: Jinwon Ma, Hwaseong-si (KR); Jun-Noh Lee, Hwaseong-si (KR); Dong-Hyun Im, Suwon-si (KR); Youngseok Kim, Seoul (KR); Kongsoo Lee, Hwaseong-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 15/603,668

(22) Filed: May 24, 2017

(65) Prior Publication Data

US 2017/0345824 A1 Nov. 30, 2017

(30) Foreign Application Priority Data

May 27, 2016 (KR) .................. 10-2016-0065887

(51) Int. Cl.
*H01L 27/108* (2006.01)
*H01L 21/768* (2006.01)

(52) U.S. Cl.
CPC .. *H01L 27/10888* (2013.01); *H01L 21/76805* (2013.01); *H01L 21/76883* (2013.01); *H01L 21/76895* (2013.01); *H01L 27/10855* (2013.01)

(58) Field of Classification Search
CPC ......... H01L 27/10888; H01L 27/10855; H01L 21/76805; H01L 21/76883; H01L 21/76895

USPC ........................................ 438/396
See application file for complete search history.

(56) References Cited

U.S. PATENT DOCUMENTS

| 6,127,732 | A | 10/2000 | Batra et al. |
|---|---|---|---|
| 6,903,014 | B2 | 6/2005 | Batra et al. |
| 7,851,303 | B2 | 12/2010 | Mikasa |
| 9,177,891 | B2 | 11/2015 | Kim et al. |
| 2008/0153279 | A1 | 6/2008 | Hwang |
| 2010/0155799 | A1 | 6/2010 | Yokoyama |
| 2015/0056791 | A1* | 2/2015 | Onodera ............... C23C 16/045 438/479 |
| 2015/0214291 | A1 | 7/2015 | Park et al. |

FOREIGN PATENT DOCUMENTS

| JP | H0697074 A | 4/1994 |
|---|---|---|
| JP | H07335660 A | 12/1995 |
| JP | 2000260785 A | 9/2000 |
| KR | 20080001195 A | 1/2008 |

\* cited by examiner

*Primary Examiner* — Caleen Sullivan
(74) *Attorney, Agent, or Firm* — Ward and Smith, P.A.

(57) ABSTRACT

A method of fabricating a semiconductor device includes forming an interlayer insulating structure on a substrate, forming a contact hole that penetrates the interlayer insulating structure to expose the substrate, forming an amorphous silicon layer including a first portion and a second portion, the first portion covering a top surface of the substrate exposed by the contact hole, the second portion covering a sidewall of the contact hole, providing hydrogen atoms into the amorphous silicon layer, and crystallizing the first portion using the substrate as a seed.

18 Claims, 39 Drawing Sheets

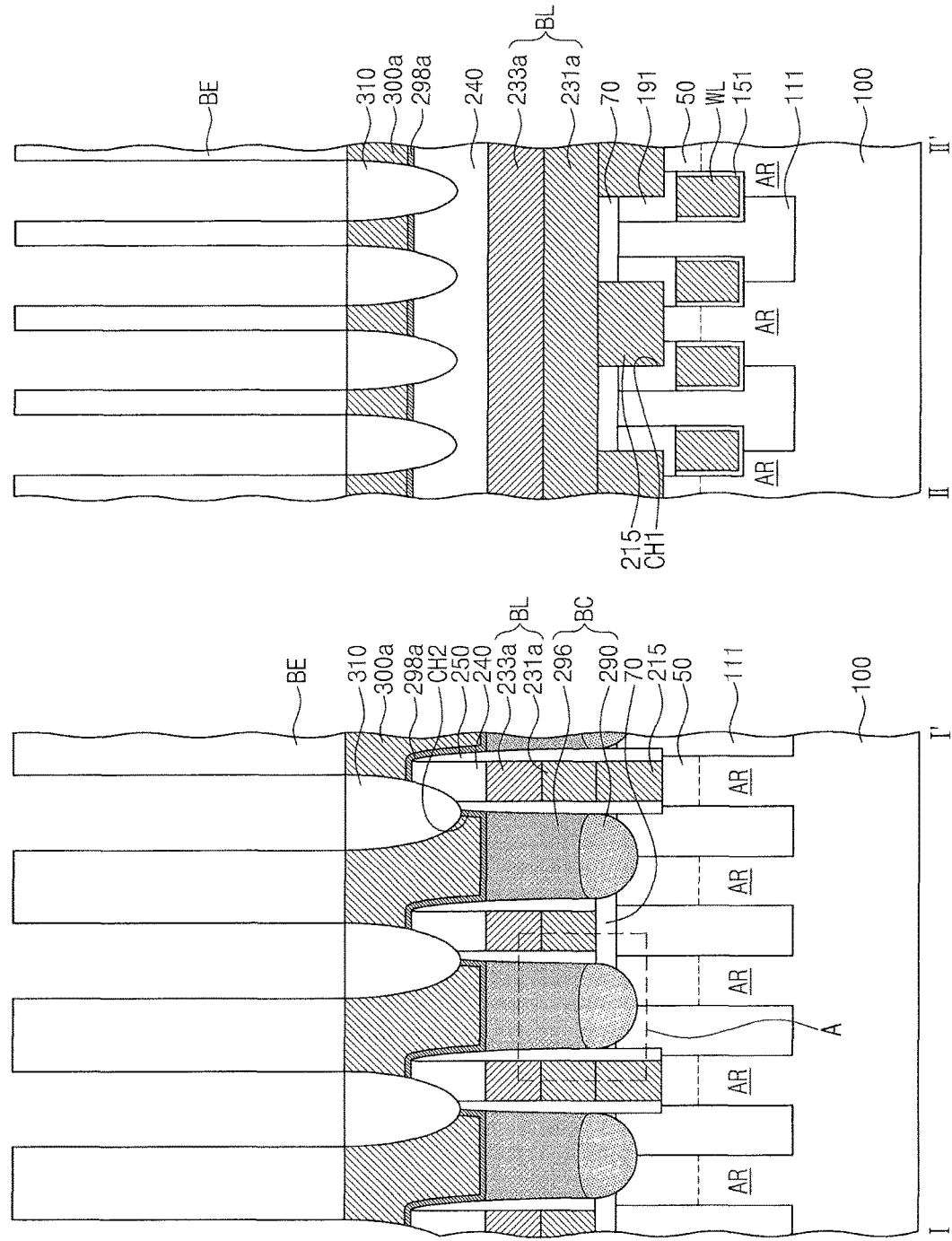

METHODS OF FABRICATING SEMICONDUCTOR DEVICES

CROSS-REFERENCE TO RELATED APPLICATION

This U.S. non-provisional patent application claims priority under 35 U.S.C. § 119 to Korean Patent Application No. 10-2016-0065887, filed on May 27, 2016, in the Korean Intellectual Property Office, the disclosure of which is hereby incorporated by reference in its entirety.

BACKGROUND

Embodiments of the inventive concept relate to methods of fabricating semiconductor devices and, more particularly, to methods of fabricating semiconductor devices with improved reliability.

Semiconductor devices are widely used in the electronics industry at least because of their small sizes, multi-functional characteristics, and/or low fabrication costs. However, semiconductor devices have been highly integrated with the development of the electronics industry. Widths and spaces of patterns included in semiconductor devices have been reduced to increase the integration density of semiconductor devices. However, since new exposure techniques and/or expensive exposure techniques are needed to form fine patterns, it may be difficult to highly integrate semiconductor devices. Thus, various research is being conducted for new integration techniques.

SUMMARY

Embodiments of the inventive concepts may provide methods of fabricating semiconductor devices with improved reliability.

In an aspect, a method of fabricating a semiconductor device may include forming an interlayer insulating structure on a substrate, forming a contact hole that penetrates the interlayer insulating structure to expose the substrate, forming an amorphous silicon layer including a first portion and a second portion, the first portion covering a top surface of the substrate exposed by the contact hole, the second portion covering a sidewall of the contact hole, providing hydrogen atoms into the amorphous silicon layer, and crystallizing the first portion using the substrate as a seed.

In an aspect, a method of fabricating a semiconductor device may include forming an interlayer insulating structure on a substrate, forming a contact hole that penetrates the interlayer insulating structure to expose the substrate, forming an amorphous silicon layer covering a sidewall of the contact hole and a top surface of the substrate exposed by the contact hole, performing a thermal treatment process on the amorphous silicon layer, forming a lower contact plug filling a lower region of the contact hole by crystallizing a portion of the amorphous silicon layer, covering the top surface of the substrate, using the substrate as a seed and by growing the crystallized portion, and forming an upper contact plug on the lower contact plug in an upper region of the contact hole. An average grain size of the lower contact plug may be greater than an average grain size of the upper contact plug.

In an aspect, a method of fabricating a semiconductor device may include forming a contact hole that penetrates an interlayer insulating structure disposed on a substrate to expose the substrate, forming an amorphous silicon layer covering a sidewall of the contact hole and a top surface of the substrate exposed by the contact hole, performing a thermal treatment process on the amorphous silicon layer in a hydrogen ($H_2$) atmosphere, forming a lower contact plug having a convex top surface filling a lower region of the contact hole by crystallizing a portion of the amorphous silicon layer, covering the top surface of the substrate, using the substrate as a seed and growing the crystallized portion, and forming an upper contact plug including poly-crystalline silicon on the lower contact plug in an upper region of the contact hole, wherein an average grain size of the lower contact plug is greater than an average grain size of the upper contact plug.

BRIEF DESCRIPTION OF THE DRAWINGS

The inventive concept will become more apparent in view of the attached drawings and accompanying detailed description.

FIG. 2A is a cross-sectional view taken along lines I-I' and II-II' of FIG. 1 to illustrate a semiconductor device according to some embodiments of the inventive concept.

FIGS. 3A to 20A are plan views illustrating a method of fabricating a semiconductor device, according to some embodiments of the inventive concept.

FIGS. 3B to 20B are cross-sectional views taken along lines I-I' and II-II' of FIGS. 3A to 20A, respectively, to illustrate a method of fabricating a semiconductor device, according to some embodiments of the inventive concept.

DETAILED DESCRIPTION OF THE EMBODIMENTS

Figure 1:
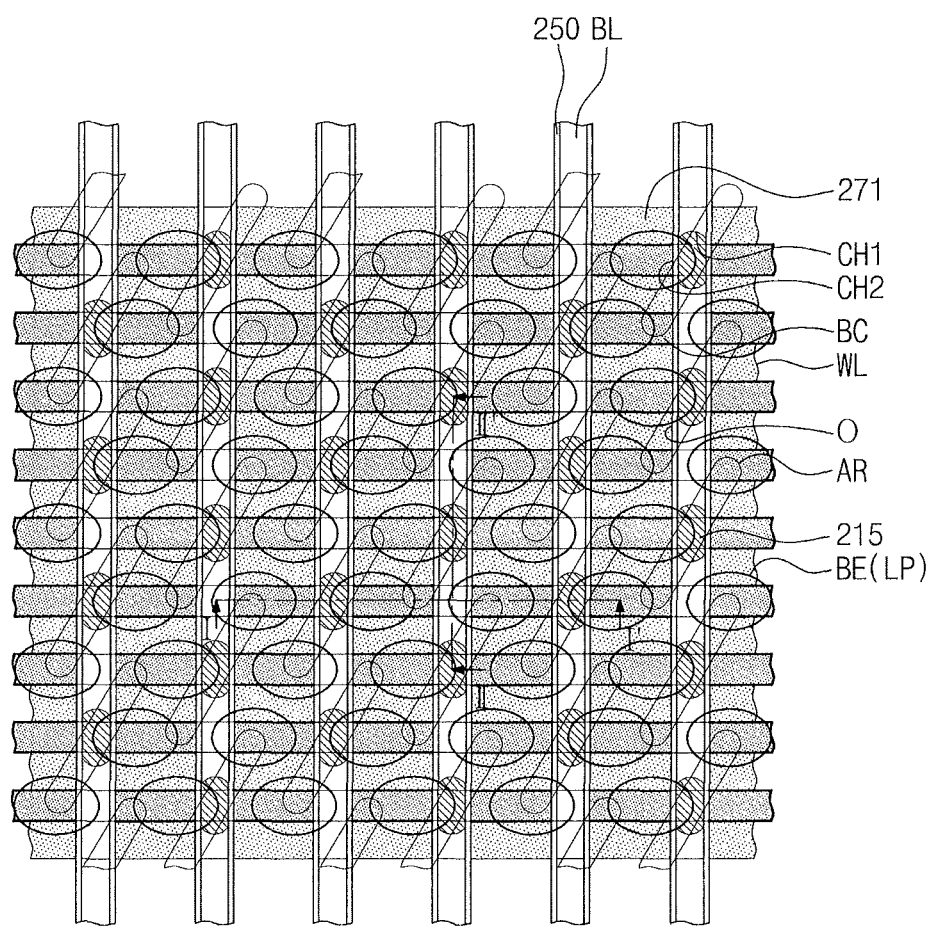
FIG. 1 is a plan view illustrating a semiconductor device according to some embodiments of the inventive concept.
Figure 1:
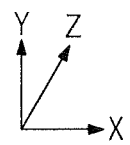
Figure 2B:
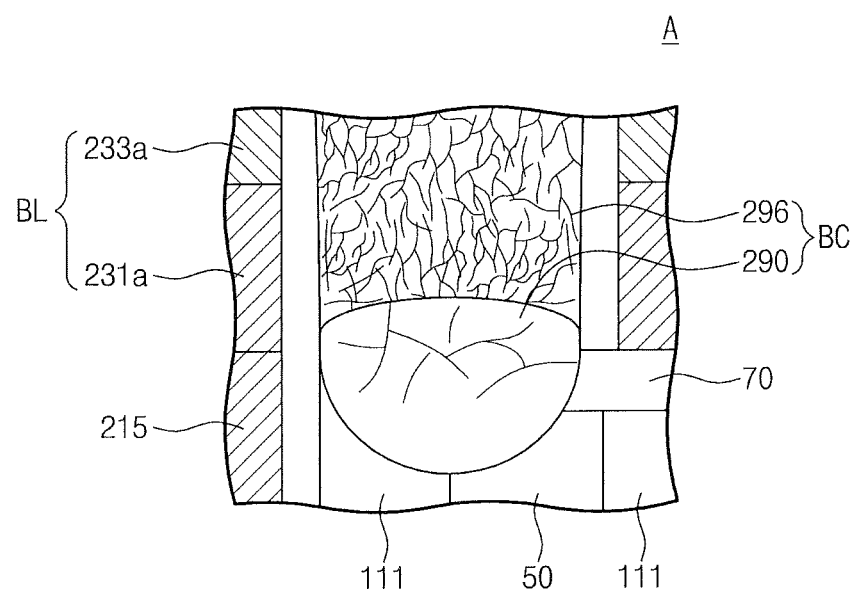
FIG. 2B is an enlarged view of a portion 'A' of FIG. 2A.

FIG. 1 is a plan view illustrating a semiconductor device according to some embodiments of the inventive concept. FIG. 2A is a cross-sectional view taken along lines I-I' and II-II' of FIG. 1 to illustrate a semiconductor device according to some embodiments of the inventive concept. FIG. 2B is an enlarged view of a portion 'A' of FIG. 2A.

Referring to FIGS. 1 and 2A, a device isolation layer 111 may be disposed on a substrate 100. The substrate 100 may be a bulk silicon substrate, a silicon-on-insulator (SOI) substrate, a germanium substrate, a germanium-on-insulator (GOI) substrate, a silicon-germanium substrate, or a substrate having an epitaxial thin layer obtained by performing a selective epitaxial growth (SEG) process.

A device isolation trench may be formed in the substrate 100, and the device isolation layer 111 may be formed by filling the device isolation trench with an insulating material. For example, the device isolation layer 111 may include a silicon oxide layer. The device isolation layer 111 may define active regions AR of the substrate 100. Each of the active regions AR may have a bar shape which is extended in a third direction Z in a plan view. The active regions AR may be parallel to each other in the third direction Z.

Source/drain regions 50 may be disposed in the active regions AR of the substrate 100. The source/drain regions 50 may have a conductivity type (e.g., an N-type) different from that of the substrate 100.

Word lines WL may intersect the active regions AR. Each of the active regions AR may intersect or overlap with two word lines WL. The word lines WL may extend in a first direction X intersecting the third direction Z. In some embodiments, the word lines WL may be buried in the substrate 100. In some embodiments, top surfaces of the word lines WL may be disposed at a lower level than a top surface of the substrate 100. The word lines WL may include a conductive material. For example, the word lines WL may include at least one of doped poly-silicon, a metal material, or a metal silicide.

A gate insulating layer 151 may be disposed between the substrate 100 and sidewalls of each of the word lines WL and between the substrate 100 and a bottom surface of each of the word lines WL. For example, the gate insulating layer 151 may include a silicon oxide layer or a thermal oxide layer. Capping patterns 191 may be disposed on the word lines WL and the gate insulating layers 151. Top surfaces of the capping patterns 191 may be disposed at the same level as the top surface of the substrate 100. The capping patterns 191 may include an insulating material (e.g., silicon oxide).

A buffer layer 70 may be disposed on the top surface of the substrate 100. The buffer layer 70 may include one or more insulating layers. For example, the buffer layer 70 may include at least one or two of a silicon oxide layer, a silicon nitride layer, or a silicon oxynitride layer.

A node contact 215 may be disposed on each of the active regions AR disposed between the two word lines WL. For example, the node contact 215 may be disposed on a central portion of each of the active regions AR. The node contact 215 may penetrate the buffer layer 70, and at least a lower portion of the node contact 215 may be buried in an upper portion of the active region AR. The node contact 215 may be electrically connected to the source/drain region 50 provided in the central portion of the active region AR. A bottom surface of the node contact 215 may be disposed at a higher level than the top surfaces of the word lines WL. A top surface of the node contact 215 may be disposed at the same level as a top surface of the buffer layer 70. For example, the node contact 215 may include at least one of a metal silicide, doped poly-silicon, a metal nitride, or a metal.

Bit lines BL may be disposed to intersect the active regions AR. The bit lines BL may extend in a second direction Y intersecting the first direction X and the third direction Z. Each of the bit lines BL may be disposed on a plurality of the node contacts 215 arranged in the second direction Y. Each of the bit lines BL may be electrically connected to the plurality of node contacts 215 arranged in the second direction Y.

Each of the bit lines BL may include a first electrode pattern 231a and a second electrode pattern 233a which are sequentially stacked on the node contacts 215. For example, the first electrode pattern 231a may include doped poly-silicon. For example, the second electrode pattern 233a may include at least one of tungsten (W), aluminum (Al), copper (Cu), nickel (Ni), or cobalt (Co). Insulating patterns 240 may be disposed on the bit lines BL, respectively. The insulating patterns 240 may extend along the bit lines BL in the second direction Y. The insulating patterns 240 may include an insulating material (e.g., silicon oxide).

Spacers 250 may be disposed on sidewalls of the bit lines BL, respectively. The spacers 250 may extend onto sidewalls of the insulating patterns 240 and sidewalls of the node contacts 215. The spacers 250 may include an insulating material. For example, the spacers 250 may include one or more, in some embodiments, at least two, of a silicon oxide layer, a silicon nitride layer, or a silicon oxynitride layer.

Storage nodes BC may be disposed on end portions of the active regions AR. Each of the storage nodes BC may include a lower contact plug 290 and an upper contact plug 296 which are sequentially stacked on each of the end portions of each of the active regions AR. The lower contact plug 290 may be disposed in a lower region of a space between the bit lines BL, and the upper contact plug 296 may be disposed in an upper region of the space between the bit lines BL. The lower contact plug 290 may be in contact with an end portion of each of the active regions AR. The lower contact plug 290 and the upper contact plug 296 may include poly-silicon (i.e., poly-crystalline silicon). The lower and upper contact plugs 290 and 296 may be doped with dopants. For example, the dopants may include phosphorus (P) or boron (B).

As illustrated in FIG. 2B, the lower contact plug 290 may include grain boundaries. The grain boundaries of the lower contact plug 290 may be more distributed in an upper portion of the lower contact plug 290 adjacent to the upper contact plug 296 than in a lower portion of the lower contact plug 290 adjacent to the substrate 100. In some embodiments, the grain boundaries may not exist in the lower portion of the lower contact plug 290 but may exist in the upper portion of the lower contact plug 290. The grain boundaries may be connected to each other in the upper portion of the lower contact plug 290, and thus one or more grains may exist in the upper portion of the lower contact plug 290. A top surface of the lower contact plug 290 may be a convex curved surface.

The upper contact plug 296 may also include grain boundaries. A density of the grain boundaries in the upper contact plug 296 may be greater than a density of the grain boundaries in the lower contact plug 290. Grains may exist in the upper contact plug 296. In some embodiments, an average grain size of the lower contact plug 290 may be greater than an average grain size of the upper contact plug 296. A top surface of the upper contact plug 296 may be substantially flat.

Referring again to FIGS. 1 and 2A, landing pads 300a may be disposed on the storage nodes BC, respectively. In more detail, each of the landing pads 300a may be disposed on each of the storage nodes BC and one of the insulating patterns 240 adjacent to each of the storage nodes BC. The landing pads 300a may include a metal material (e.g., tungsten). Barrier patterns 298a may be disposed between the landing pads 300a and the storage nodes BC, respectively. Each of the barrier patterns 298a may extend between a corresponding landing pad 300a and portions of the spacers 250 adjacent to the corresponding landing pad 300a and between the corresponding landing pad 300a and one of the insulating patterns 240 adjacent to the corresponding landing pad 300a. For example, the barrier patterns 298a may include TiN, Ti/TiN, TiSiN, TaN, or WN.

An isolation pattern 271 may be disposed between the storage nodes BC adjacent to each other in the second direction Y. The isolation patterns 271 and the storage nodes BC may be alternately arranged in the second direction Y. Even though not shown in the drawings, top surfaces of the isolation patterns 271 may be disposed at the same level as top surfaces of the insulating patterns 240. For example, the isolation patterns 271 may include at least one of a SiBCN layer, a SiCN layer, a SiOCN layer, or a SiN layer.

A gap-fill pattern 310 may be disposed in a space between the landing pads 300a. A top surface of the gap-fill pattern 310 may be coplanar with top surfaces of the landing pads 300a. The gap-fill pattern 310 may include an insulating material (e.g., silicon oxide).

Data storage elements may be disposed on the landing pads 300a, respectively. For example, the data storage elements may be capacitors. The capacitor may include a bottom electrode BE, a dielectric layer (not shown), and a top electrode (not shown). In some embodiments, the bottom electrodes BE may be arranged in a zigzag form in the second direction Y.

FIGS. 3A to 20A are plan views illustrating a method of fabricating a semiconductor device, according to some embodiments of the inventive concepts. FIGS. 3B to 20B are cross-sectional views taken along lines I-I' and II-II' of FIGS. 3A to 20A, respectively, to illustrate a method of fabricating a semiconductor device, according to some embodiments of the inventive concept.

Figure 3A:
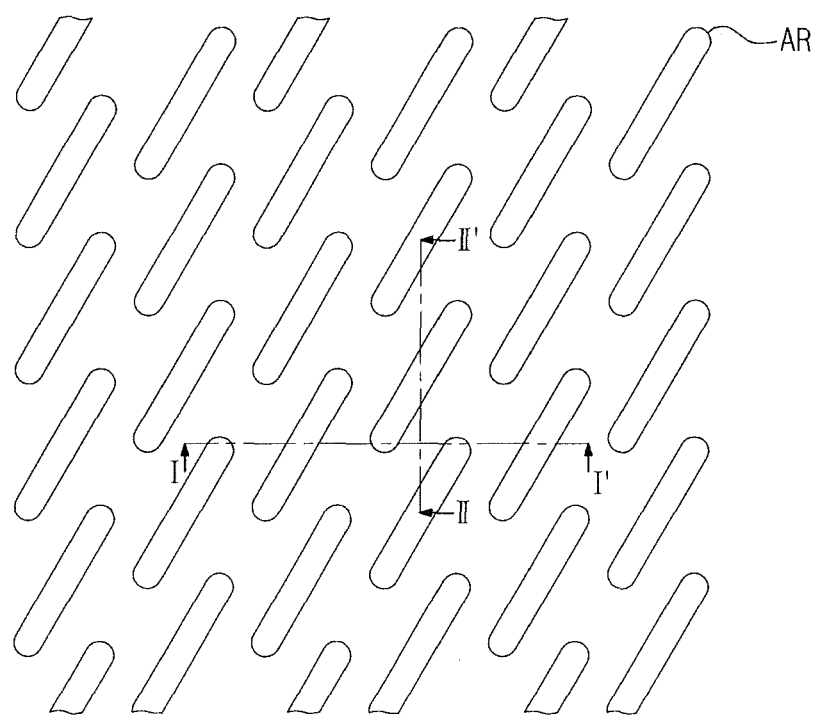
Figure 3B:
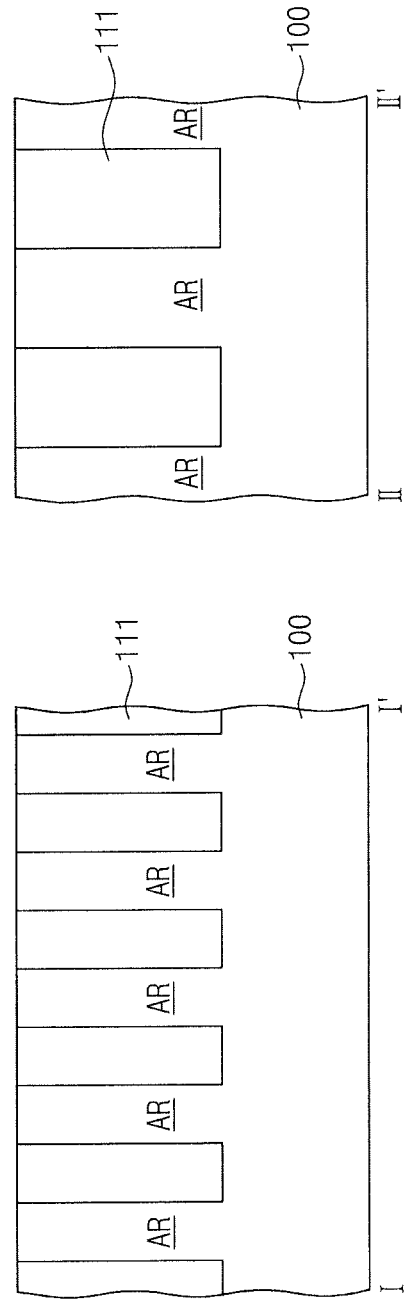

Referring to FIGS. 3A and 3B, a device isolation layer 111 may be formed in a substrate 100. A device isolation trench may be formed in the substrate 100, and the device isolation layer 111 may be formed by filling the device isolation trench with an insulating material. The substrate 100 may be a bulk silicon substrate, a silicon-on-insulator (SOI) substrate, a germanium substrate, a germanium-on-insulator (GOI) substrate, a silicon-germanium substrate, or a substrate having an epitaxial thin layer obtained by performing a selective epitaxial growth (SEG) process. For example, the device isolation layer 111 may include at least one of silicon oxide, silicon nitride, or silicon oxynitride.

Active regions AR of the substrate 100 may be defined by the device isolation layer 111. The active regions AR may have bar shapes which are extended in a third direction Z in a plan view. The active regions AR may be parallel to each other.

Figure 4A:
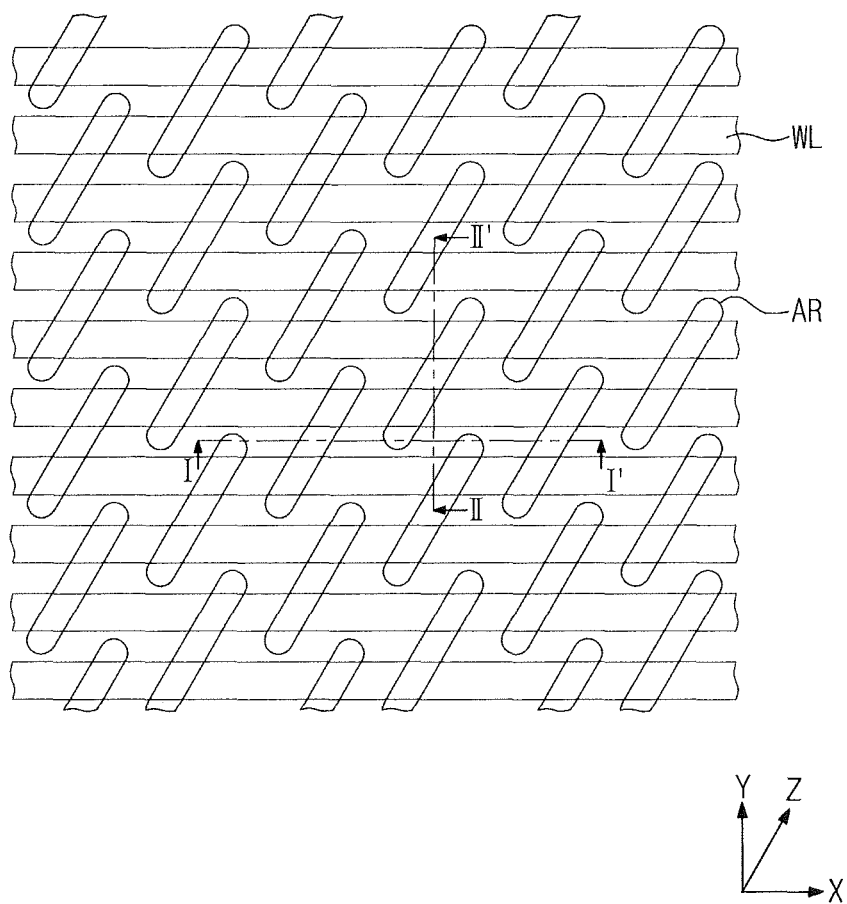
Figure 4B:
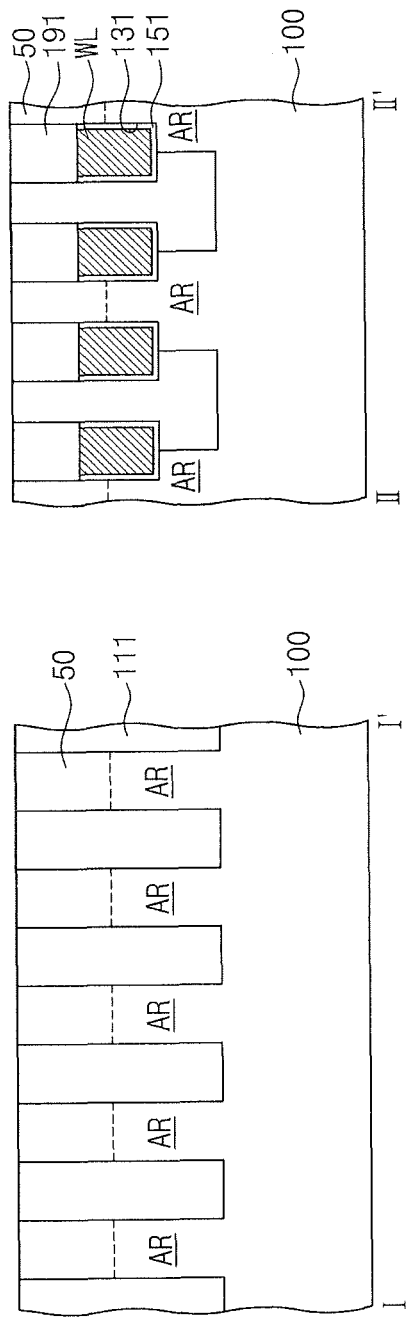

Referring to FIGS. 4A and 4B, source/drain regions 50 may be formed in the active regions AR. In some embodiments, an ion implantation mask (not shown) may be formed on the substrate 100, and an ion implantation process may be performed using the ion implantation mask to form the source/drain regions 50 in the active regions AR. In certain embodiments, the ion implantation process may be performed without the ion implantation mask.

Trenches 131 may be formed in the substrate 100. The trenches 131 may extend in a first direction X intersecting the third direction Z to intersect the active regions AR. For example, each of the active regions AR may intersect or overlap with two trenches 131. A gate insulating layer 151 may be formed to conformally cover an inner surface of each of the trenches 131. The gate insulating layer 151 may be formed of an insulating material, e.g., a silicon oxide layer or a thermal oxide layer. A word line WL may be formed on the gate insulating layer 151 in each of the trenches 131. In some embodiments, a metal layer may be formed to fill the trenches 131, and an etching process may be performed on the metal layer to leave portions of the metal layer in lower regions of the trenches 131. Thus, the word lines WL may be formed. When the metal layer is etched, a portion of the gate insulating layer 151 may also be etched. The word lines WL may be formed of a conductive material, e.g., doped poly-silicon, a metal material, and/or a metal silicide.

Capping patterns 191 may be formed in the trenches 131 having the word lines WL, respectively. The capping patterns 191 may be formed on the word lines WL and may completely fill the trenches 131. For example, the capping patterns 191 may include at least one of silicon oxide, silicon nitride, or silicon oxynitride.

Figure 5A:
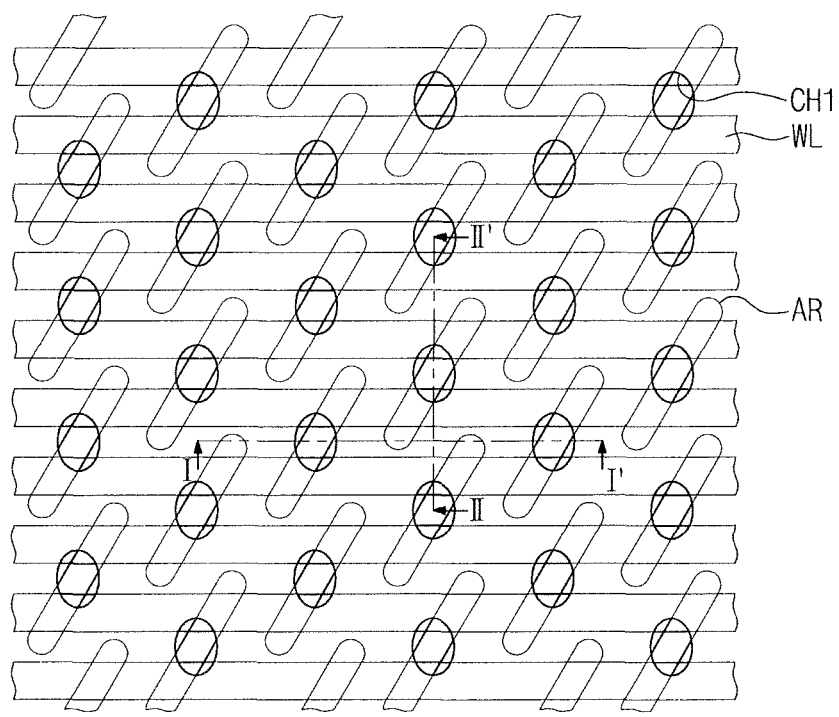
Figure 5A:
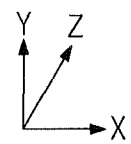
Figure 5B:
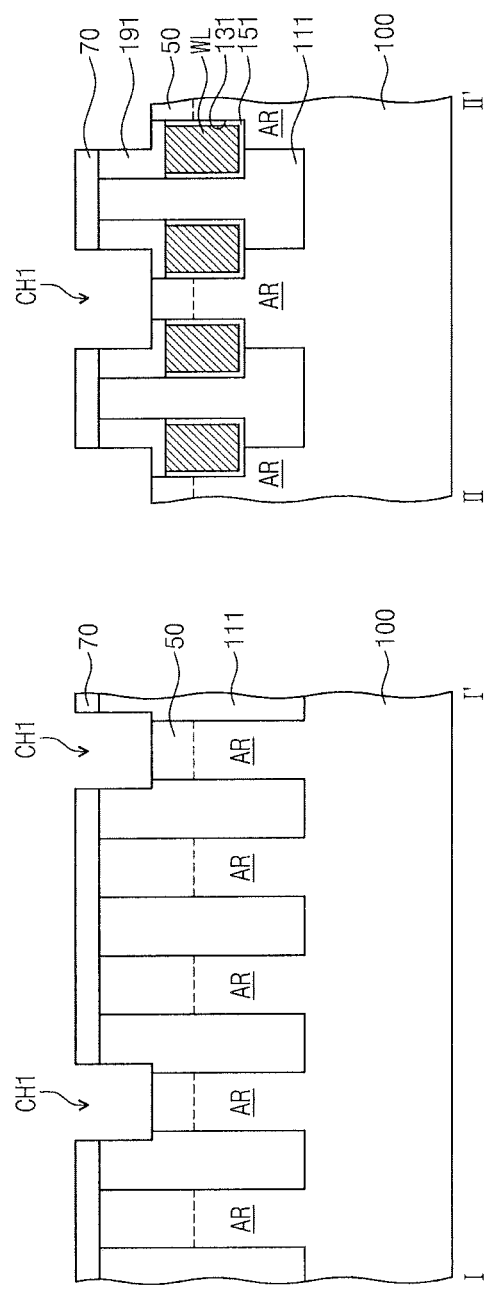

Referring to FIGS. 5A and 5B, a buffer layer 70 may be formed on the substrate 100. The buffer layer 70 may include one or more insulating layers. For example, the buffer layer 70 may be formed of at least one or two of a silicon oxide layer, a silicon nitride layer, or a silicon oxynitride layer. Even though not shown in the drawings, a mask pattern (not shown) having openings (not shown) may be formed on the buffer layer 70.

An etching process may be performed to etch the buffer layer 70 and the substrate 100 which are exposed by the mask pattern. Portions of the buffer layer 70 and portions of an upper portion of the substrate 100 may be etched by the etching process, and thus first contact holes CH1 may be formed in the buffer layer 70 and the active regions AR. Each of the first contact holes CH1 may be formed in a central portion of each of the active regions AR between the two word lines WL when viewed from a plan view. The first contact hole CH1 may expose the source/drain region 50 disposed between the two word lines WL.

Figure 6A:
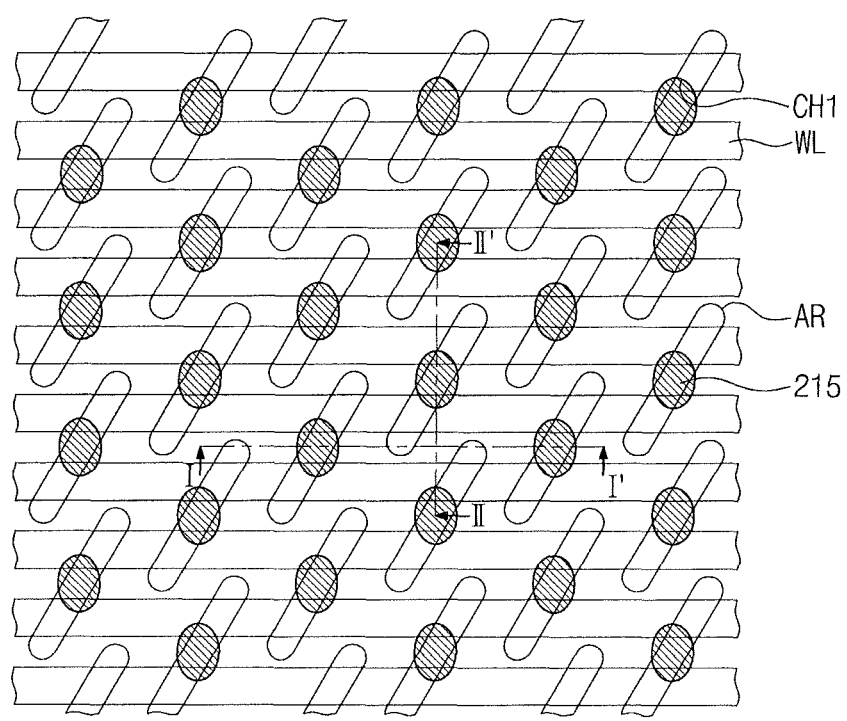
Figure 6B:
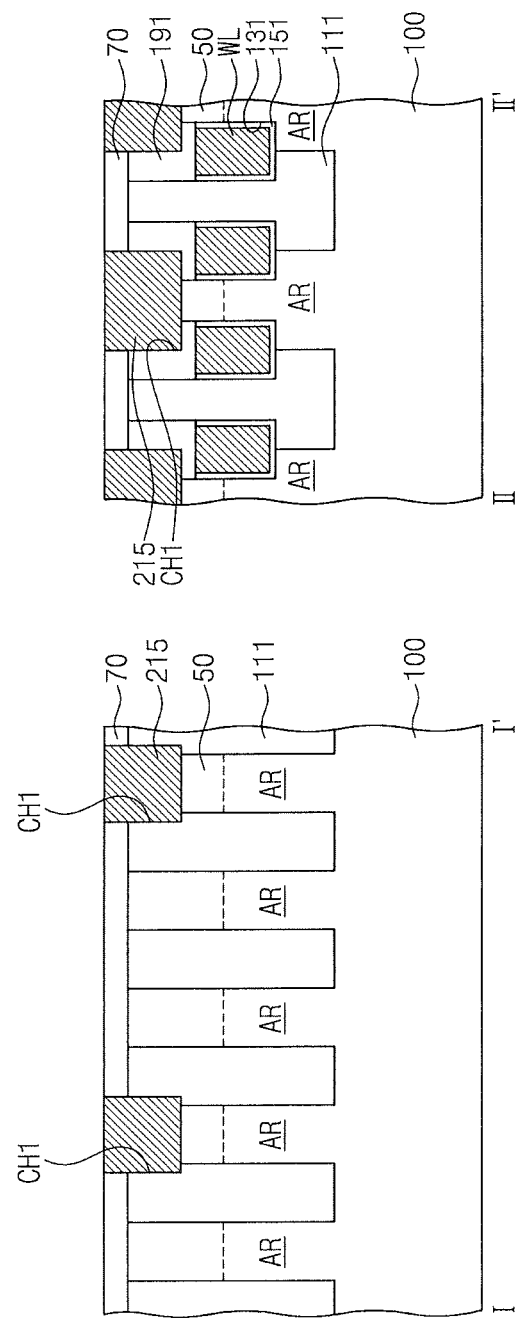

Referring to FIGS. 6A and 6B, node contacts 215 may be formed in the first contact holes CH1, respectively. In some embodiments, a conductive layer may be formed on the buffer layer 70 to fill the first contact holes CH1, and a planarization process (e.g., a chemical mechanical polishing (CMP) process or an etch-back process) may be performed on the conductive layer until a top surface of the buffer layer 70 is exposed, thereby forming the node contacts 215. For example, the node contacts 215 may include at least one of a metal silicide, doped poly-silicon, a metal nitride, or a metal.

Figure 7A:
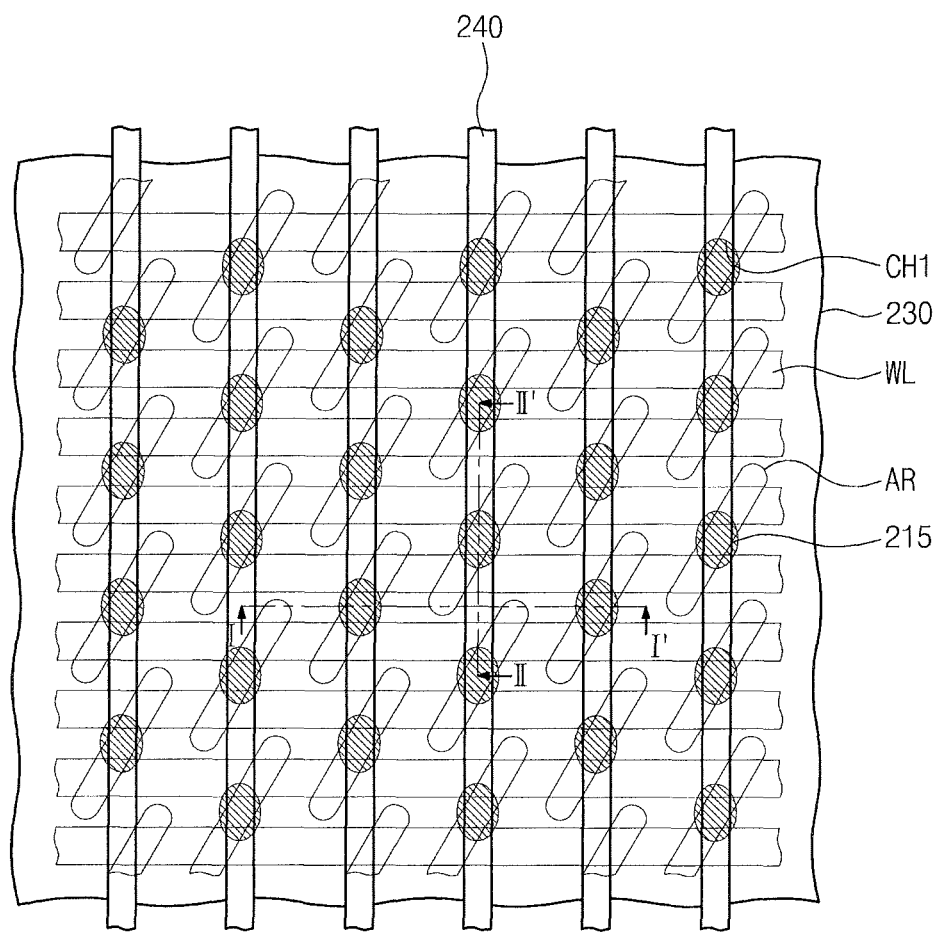
Figure 7B:
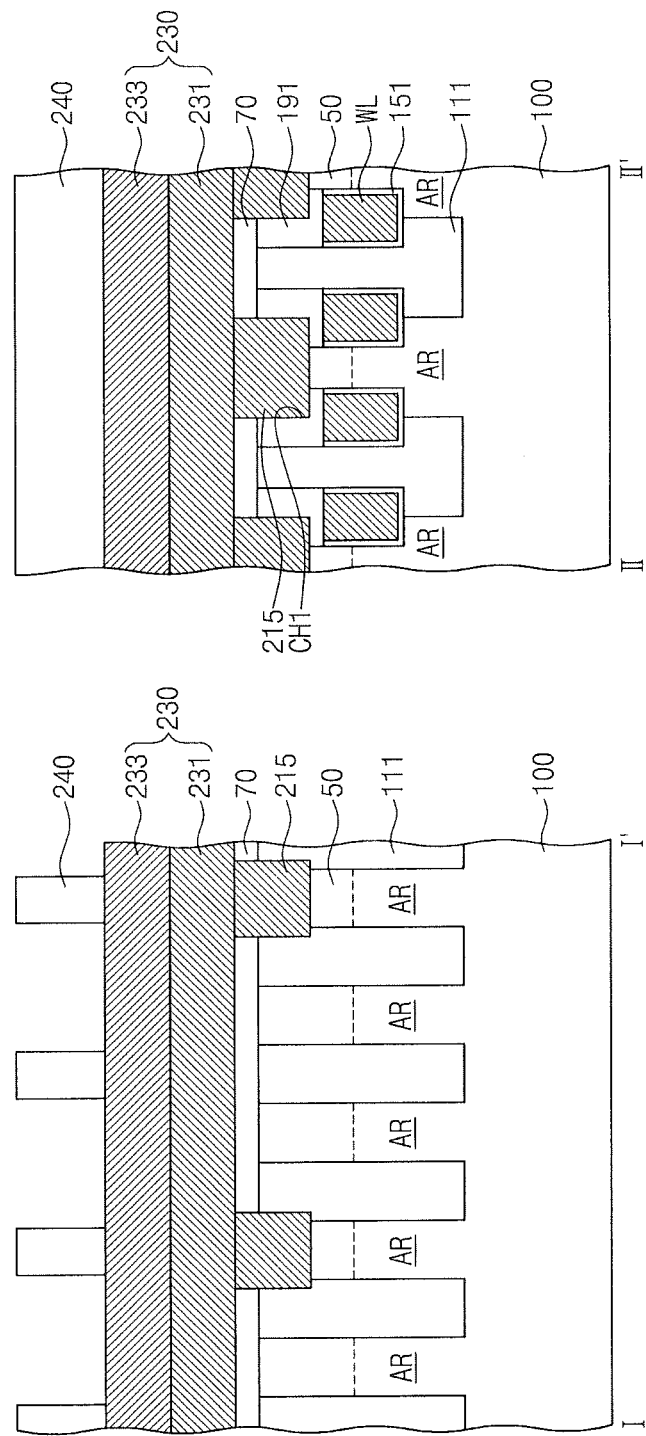

Referring to FIGS. 7A and 7B, an electrode layer 230 may be formed on the buffer layer 70. The electrode layer 230 may include a first electrode layer 231 and a second electrode layer 233 which are sequentially stacked on the buffer layer 70. For example, the first electrode layer 231 may include doped poly-silicon. For example, the second electrode layer 233 may include at least one of tungsten (W), aluminum (Al), copper (Cu), nickel (Ni), or cobalt (Co). Even though not shown in the drawings, a diffusion barrier layer (not shown) may be formed between the first electrode layer 231 and the second electrode layer 233. The diffusion barrier layer may be a diffusion barrier metal and may include, for example, TiN, Ti/TiN, TiSiN, TaN, or WN.

Insulating patterns 240 may be formed on the electrode layer 230. For example, the insulating patterns 240 may include silicon oxide or silicon nitride.

Figure 8A:
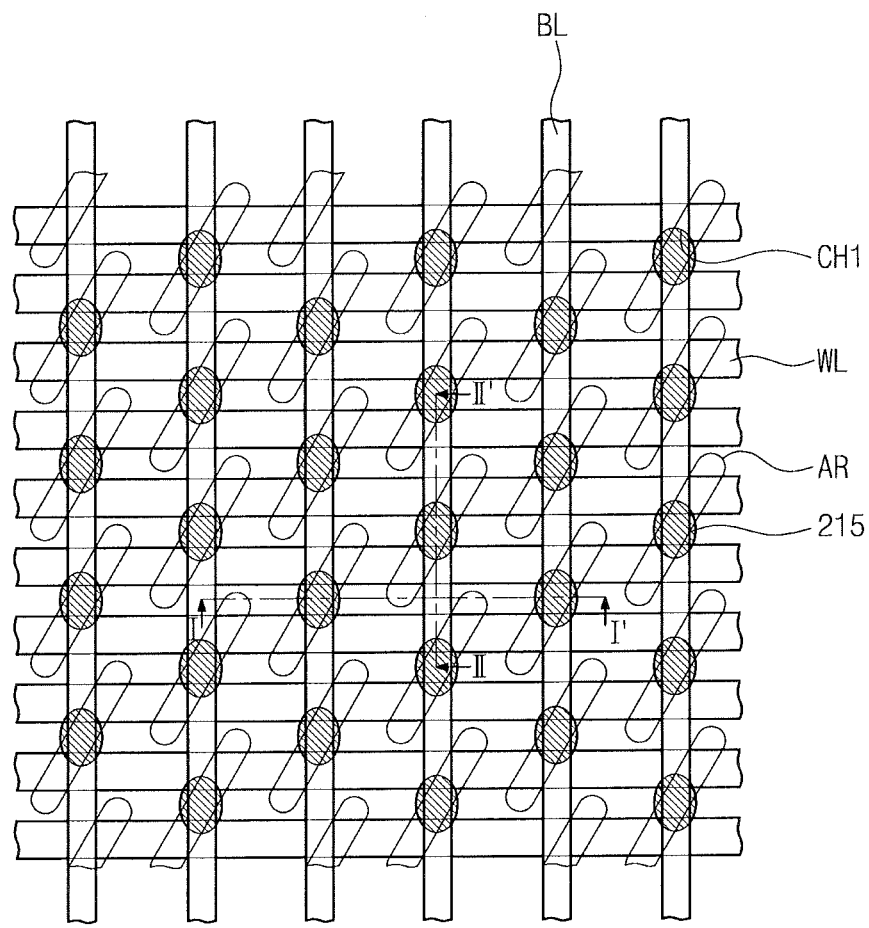
Figure 8B:
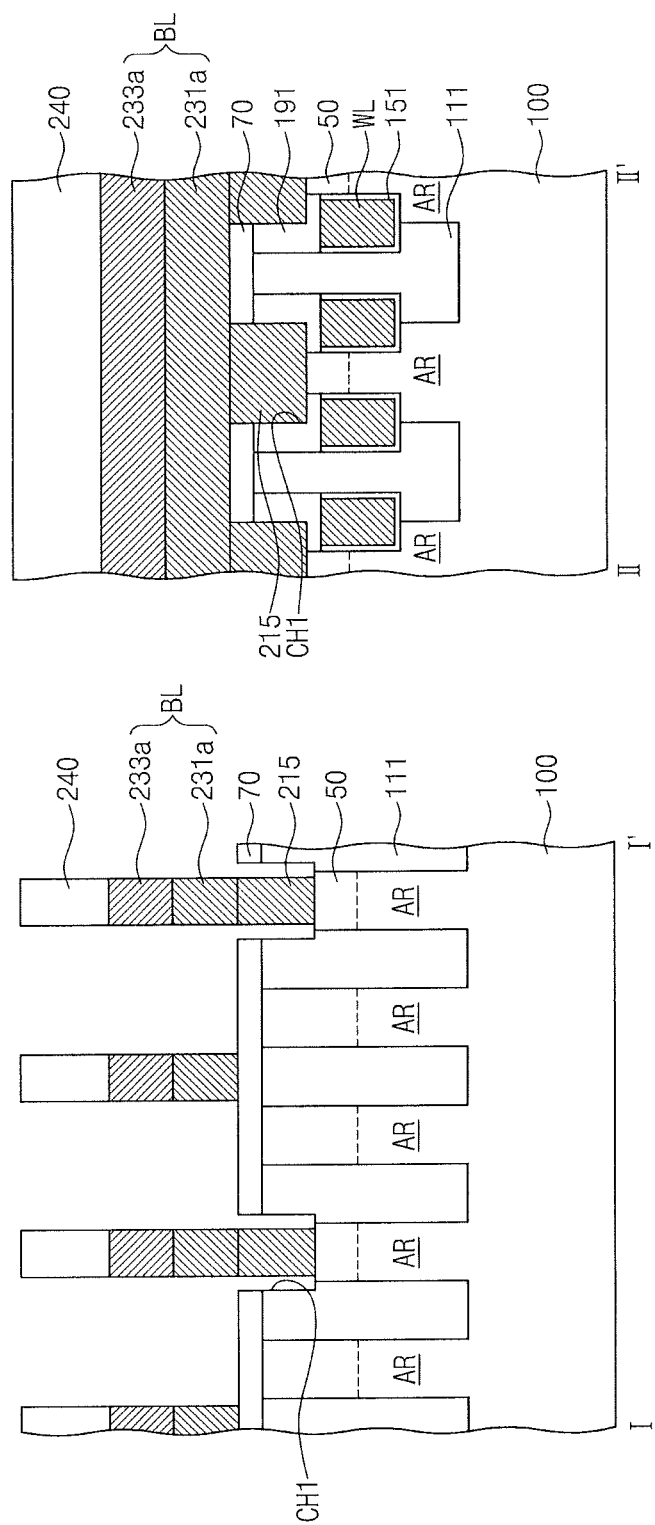

Referring to FIGS. 8A and 8B, the electrode layer 230 may be patterned using the insulating patterns 240 as an etch mask to form bit lines BL. Each of the bit lines BL may be disposed on a plurality of the node contacts 215 arranged in a second direction Y intersecting the first and third directions X and Z and may extend in the second direction Y to intersect the active regions AR. Each of the bit lines BL may include a first electrode pattern 231a and a second electrode pattern 233a which are formed by sequentially etching the second electrode layer 233 and the first electrode layer 231.

Portions of the node contacts 215 exposed by the bit lines BL may be etched after the formation of the bit lines BL, and thus widths of the node contacts 215 may be reduced. As a result, each of the node contacts 215 may be spaced apart from portions of a sidewall of a corresponding one of the first contact holes CH1.

Figure 9A:
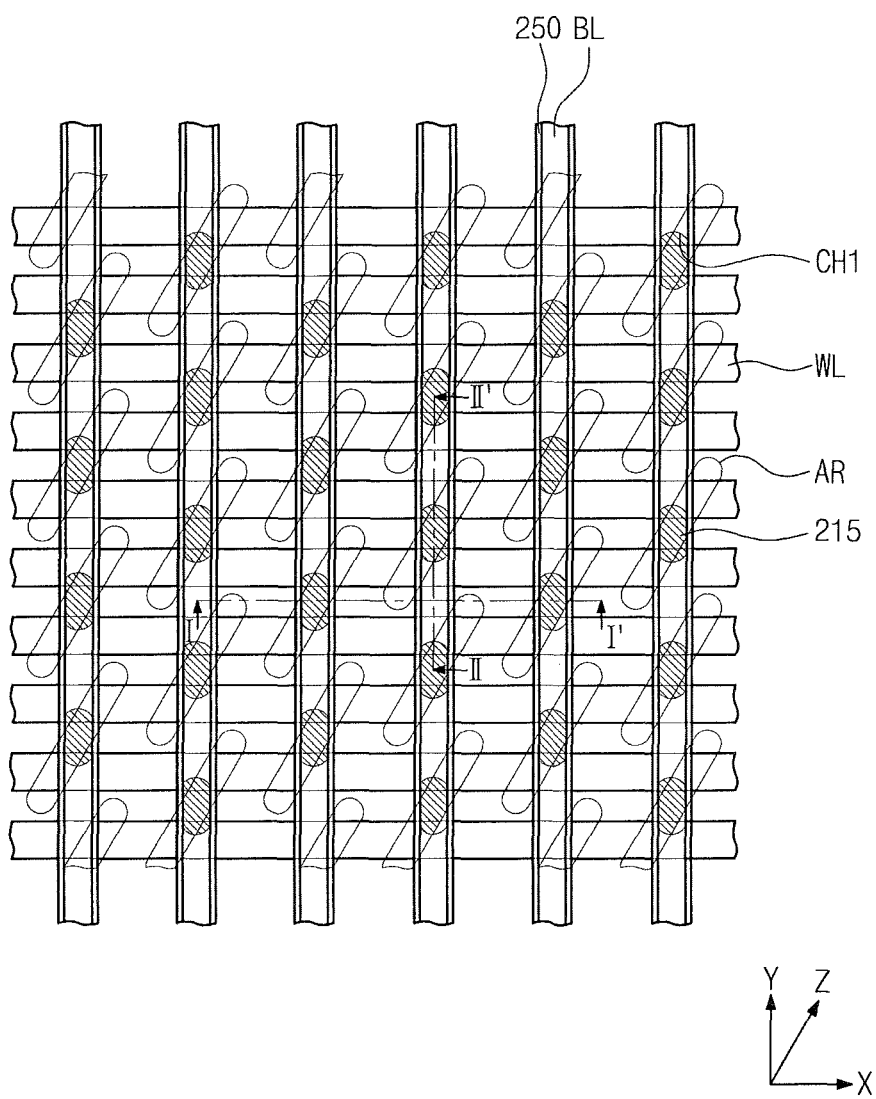
Figure 9B:
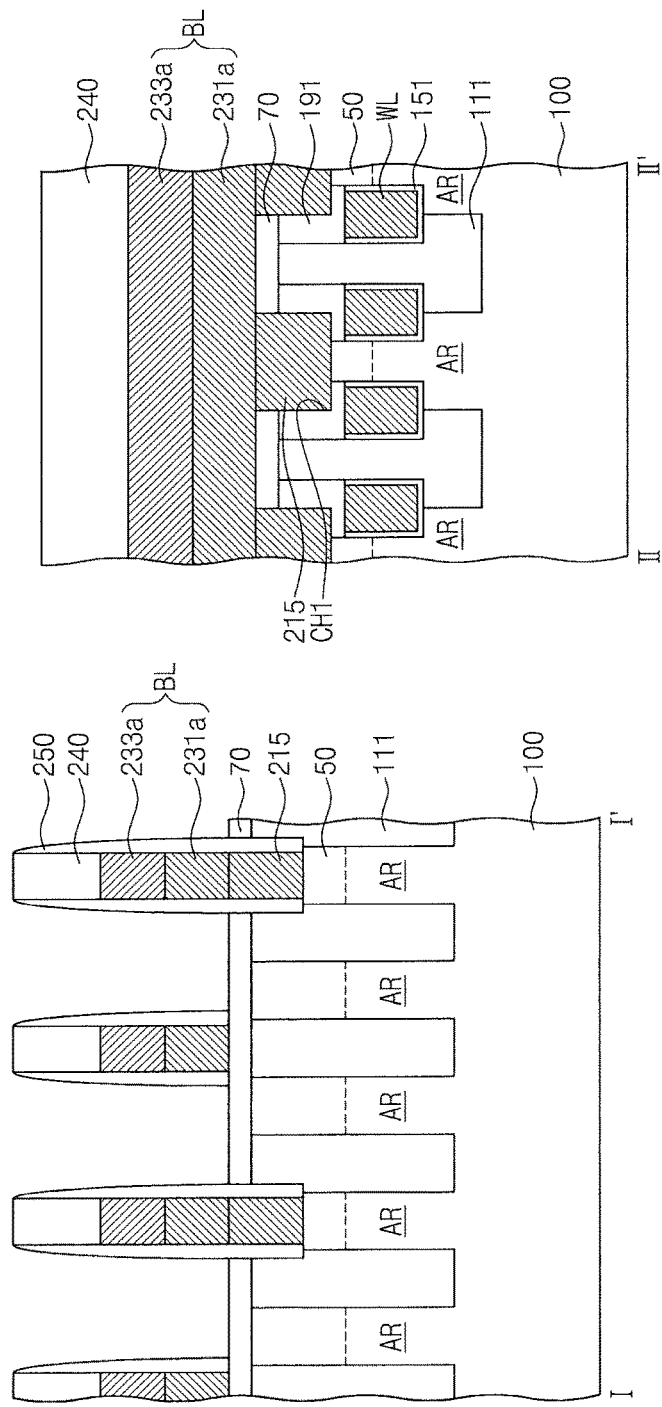

Referring to FIGS. 9A and 9B, spacers 250 may be formed to cover sidewalls of the node contacts 215, sidewalls of the bit lines BL, and sidewalls of the insulating patterns 240. In some embodiments, an insulating layer may be formed to conformally cover a top surface of the buffer layer 70, the sidewalls of the node contacts 215, the sidewalls of the bit lines BL, and the sidewalls and top surfaces of the insulating patterns 240, and an etch-back process may be performed on the insulating layer until the top surfaces of the insulating patterns 240 and the top surface of the buffer layer 70 are exposed, thereby forming the spacers 250. For example, the spacers 250 may include at least two of a silicon oxide layer, a silicon nitride layer, or a silicon oxynitride layer.

Figure 10A:
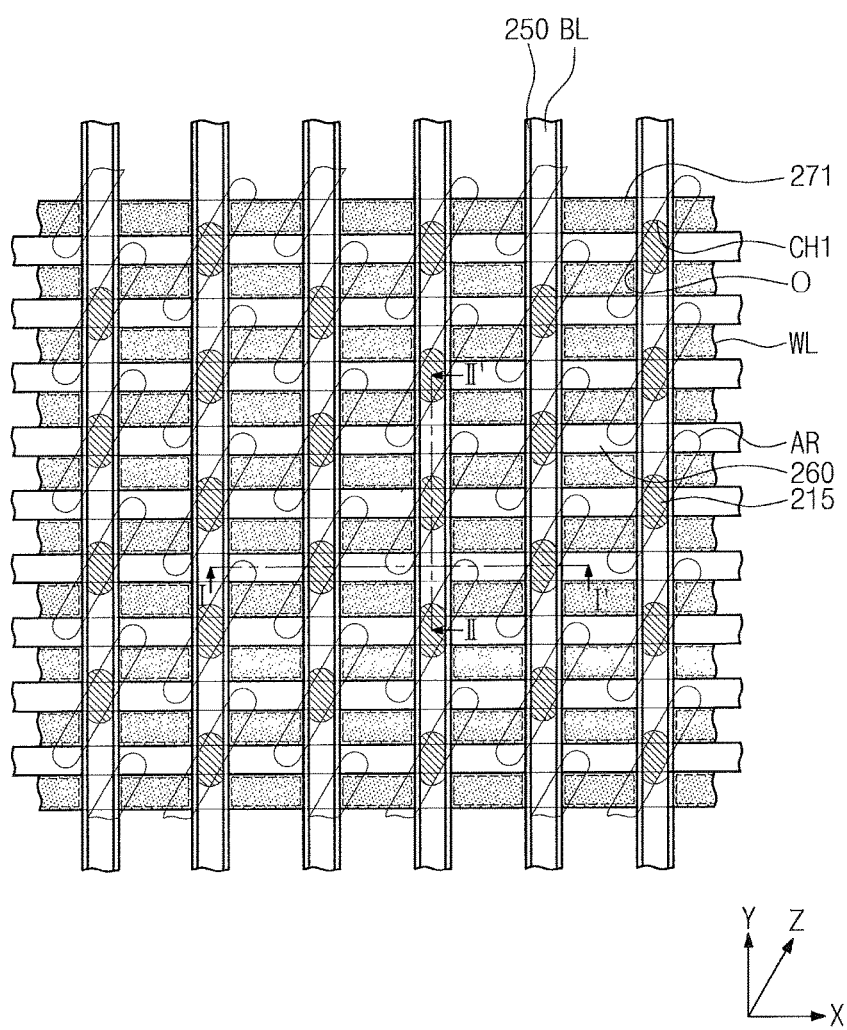
Figure 10B:
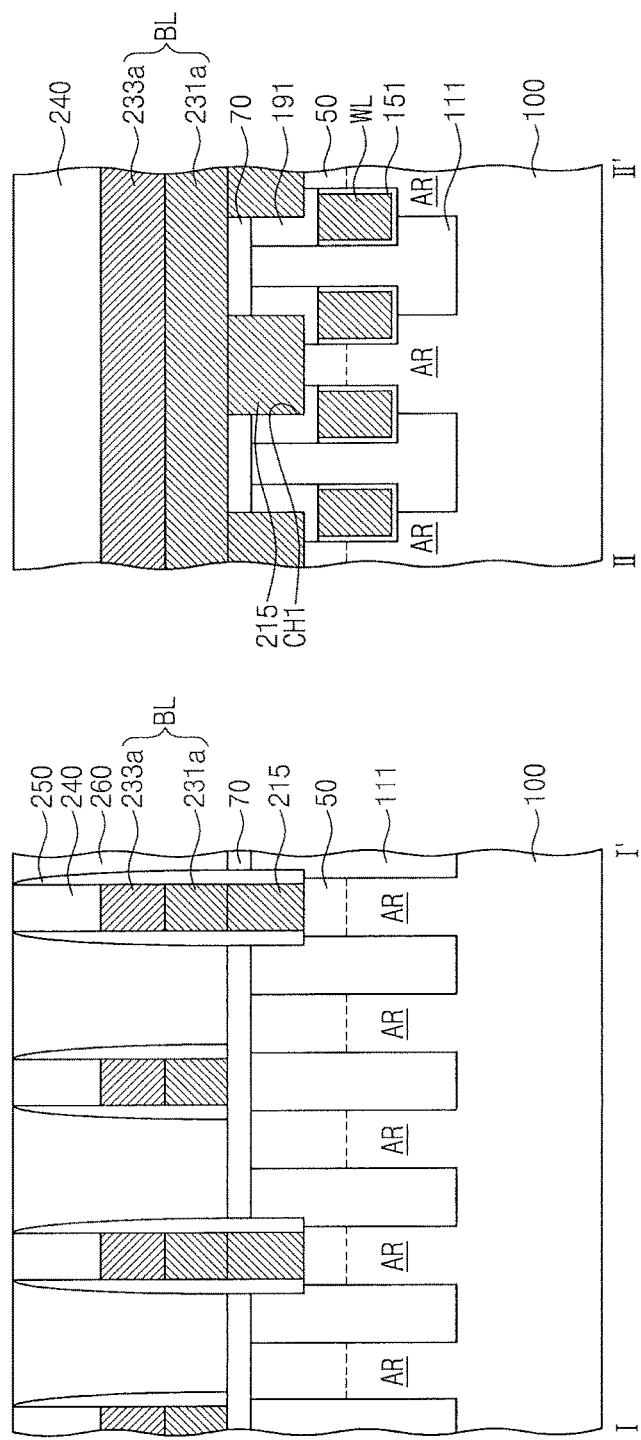

Referring to FIGS. 10A and 10B, an interlayer insulating layer 260 may be formed on the buffer layer 70. The interlayer insulating layer 260 may fill spaces between the bit lines BL. An insulating layer may be formed to fill the spaces between the bit lines BL and to cover the top surfaces of the insulating patterns 240, and a planarization process may be performed on the insulating layer until the top surfaces of the insulating patterns 240 are exposed, thereby forming the interlayer insulating layer 260.

Portions of the interlayer insulating layer 260 which overlap with the word lines WL may be etched to form openings O. Isolation patterns 271 may be formed by filling the openings O with an insulating material. The isolation patterns 271 may be formed of an insulating material having an etch selectivity with respect to the interlayer insulating layer 260. For example, the isolation patterns 271 may include at least one of a SiBCN layer, a SiCN layer, a SiOCN layer, or a SiN layer.

Figure 11A:
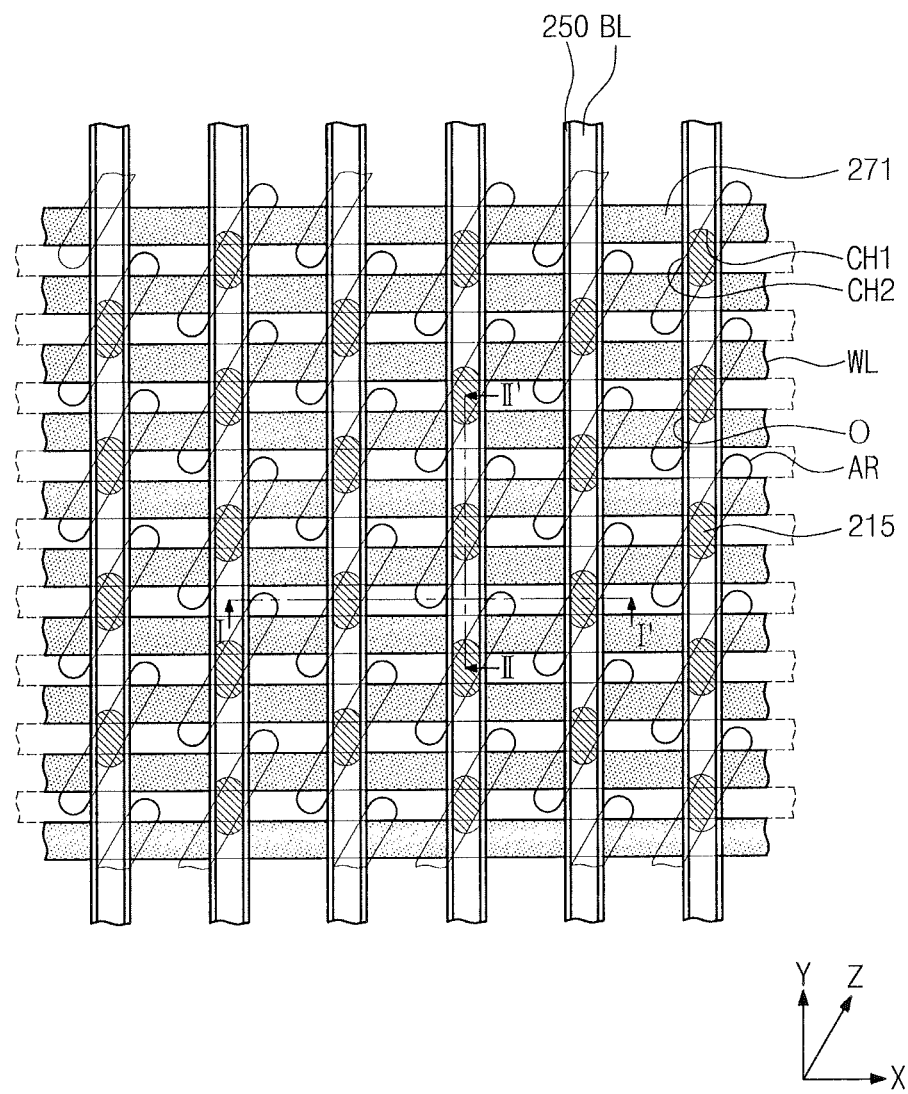
Figure 11B:
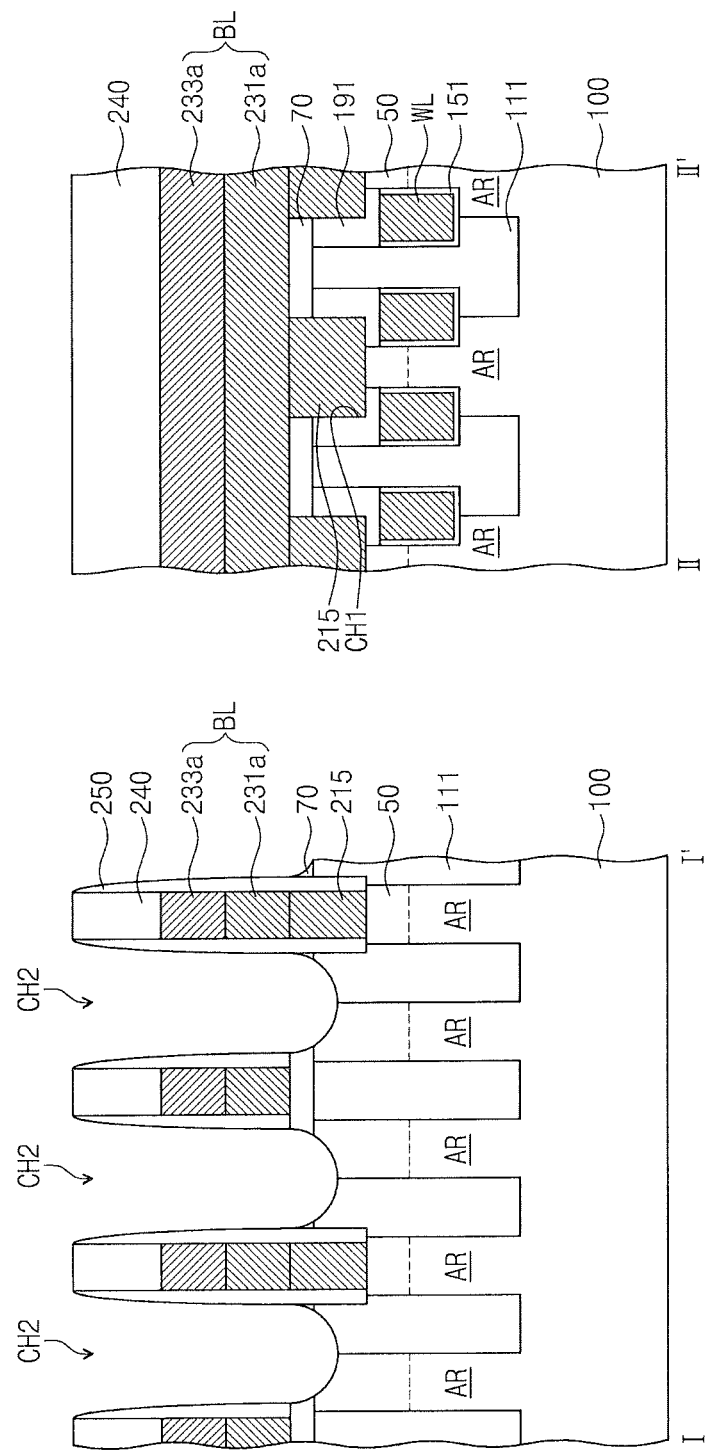

Referring to FIGS. 11A and 11B, the interlayer insulating layer 260 and the buffer layer 70 may be etched to form second contact holes CH2. In some embodiments, an interlayer insulating structure may include the interlayer insulating layer 260 and line patterns, and the second contact holes CH2 may penetrate the interlayer insulating structure. Each of the line patterns may include the bit line BL, the insulating pattern 240, and the spacers 250 disposed on both sidewalls of the bit line BL and both sidewalls of the insulating pattern 240. In addition, the interlayer insulating structure may further include the isolation patterns 271 disposed between the lines patterns. Each of the second contact holes CH2 may be formed between the isolation patterns 271 adjacent to each other in the second direction Y. Each of the second contact holes CH2 may be formed on each of end portions of the active regions AR. The spacers 250 may be exposed by the etching process for forming the second contact holes CH2. The buffer layer 70 may be over-etched during the etching process, and thus the top surface of the substrate 100 may be recessed.

After the formation of the second contact holes CH2, a cleaning process and a surface treatment process may be sequentially performed on the surface of the substrate 100 exposed through the second contact holes CH2. The cleaning process may be a process of removing a silicon oxide layer (e.g., a natural oxide layer) formed on the surface of the substrate 100, and the surface treatment process may be a process of curing the surface of the substrate 100 which is damaged by the cleaning process. For example, the cleaning process may be performed using a $NH_3$ gas, and the surface treatment process may be performed using a $Cl_2$ gas.

Figure 12A:
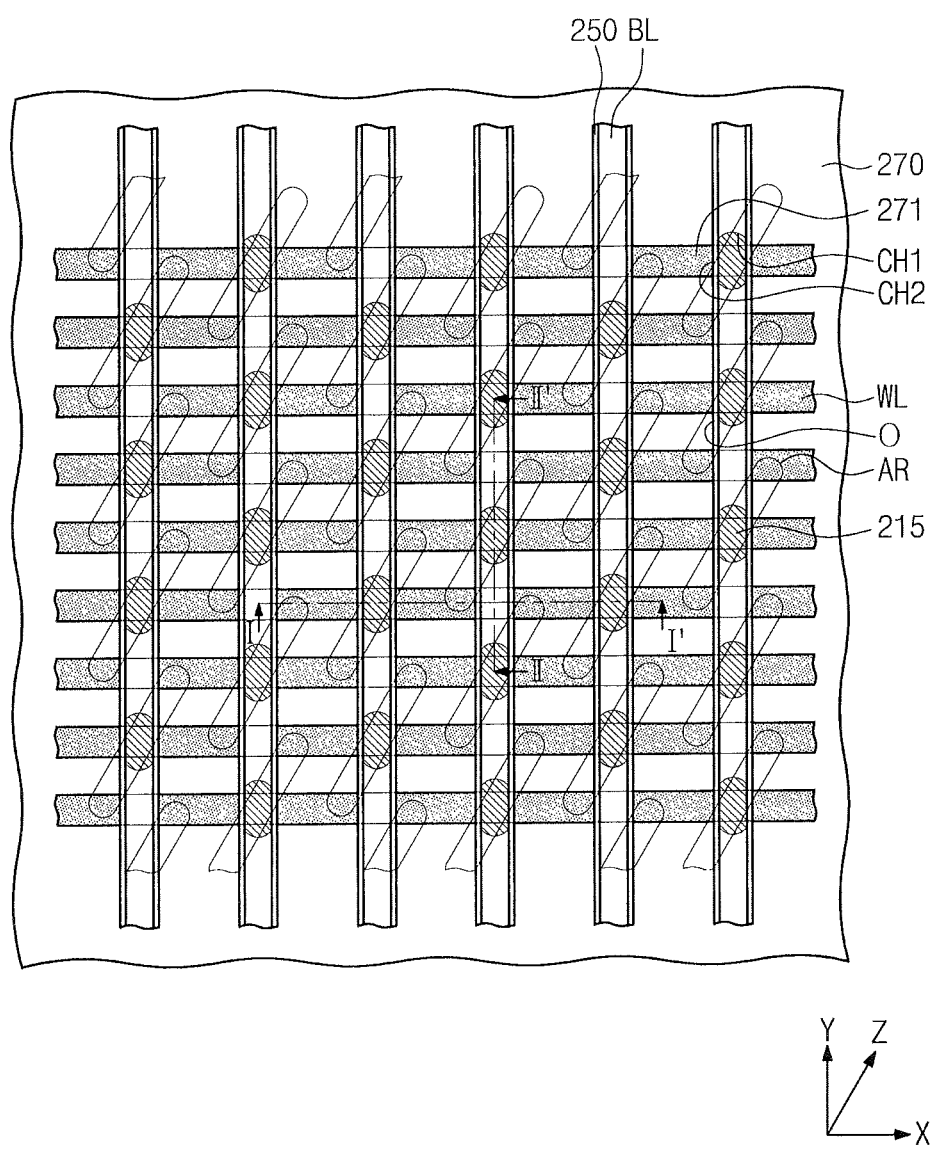
Figure 12B:
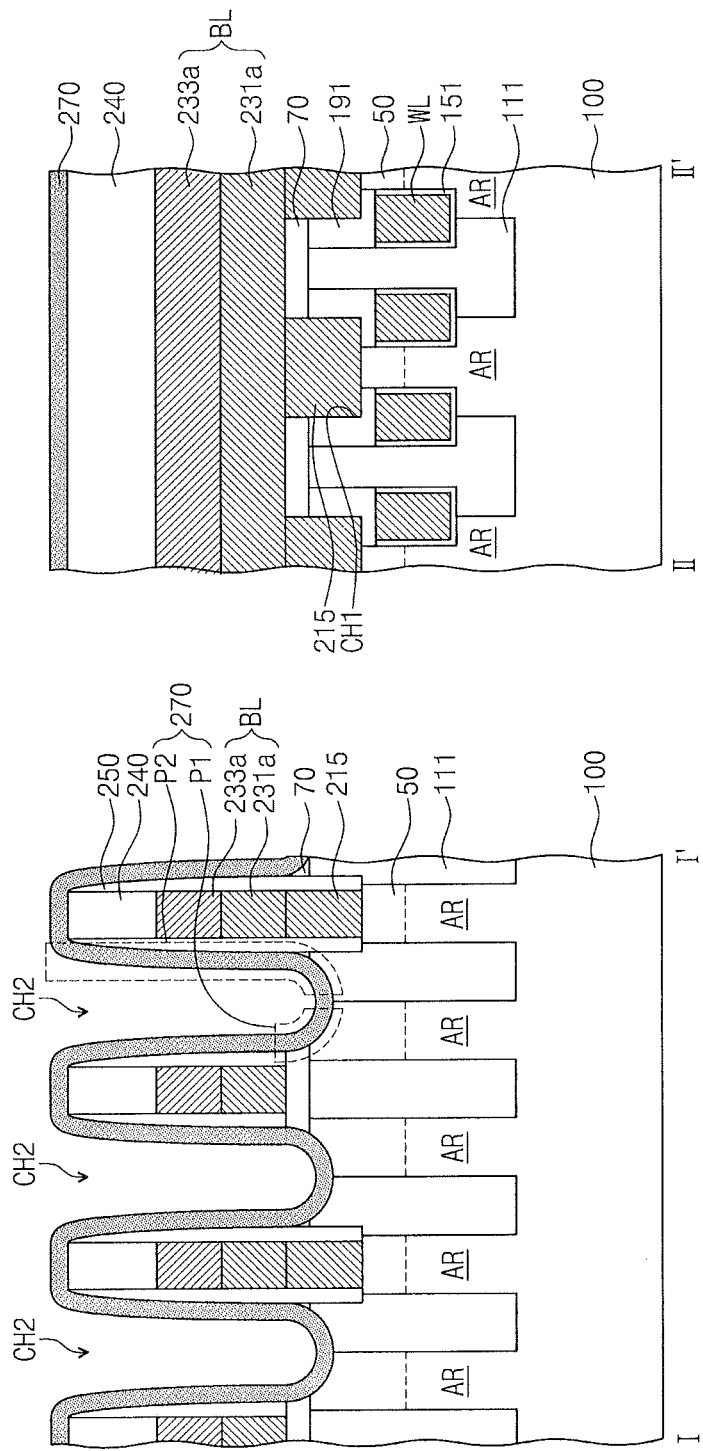

Referring to FIGS. 12A and 12B, an amorphous silicon layer 270 may be formed to conformally cover sidewalls of the spacers 250, the top surfaces of the insulating patterns 240, and the top surface of the substrate 100 exposed through the second contact holes CH2. The amorphous silicon layer 270 may include a first portion P1 covering the top surface of the substrate 100 (e.g., a top surface of the end portion of the active region AR) and a second portion P2 covering the sidewall of the spacer 250, a portion of the device isolation layer 111, and a portion of the buffer layer 70. The amorphous silicon layer 270 may include a plurality of the first portions P1 and a plurality of the second portions P2.

Figure 13A:
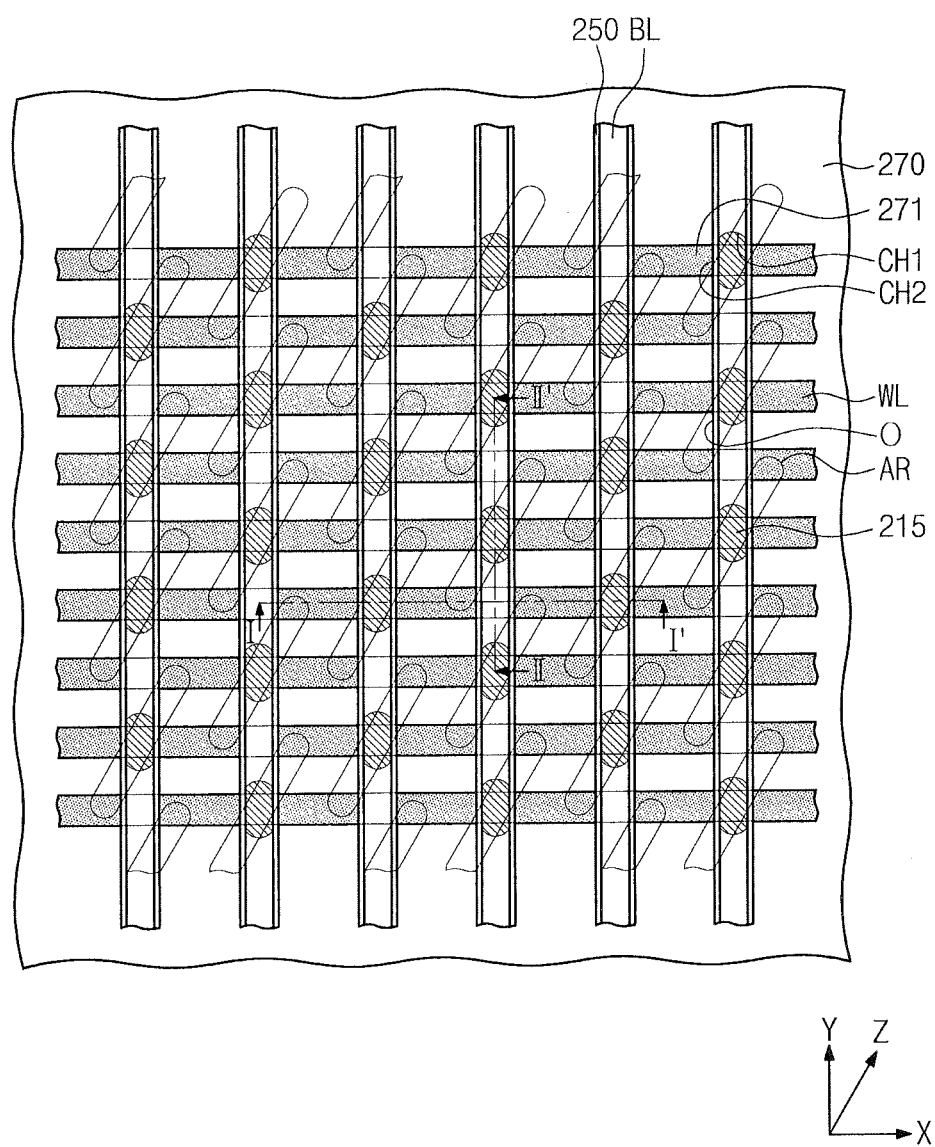
Figure 13B:
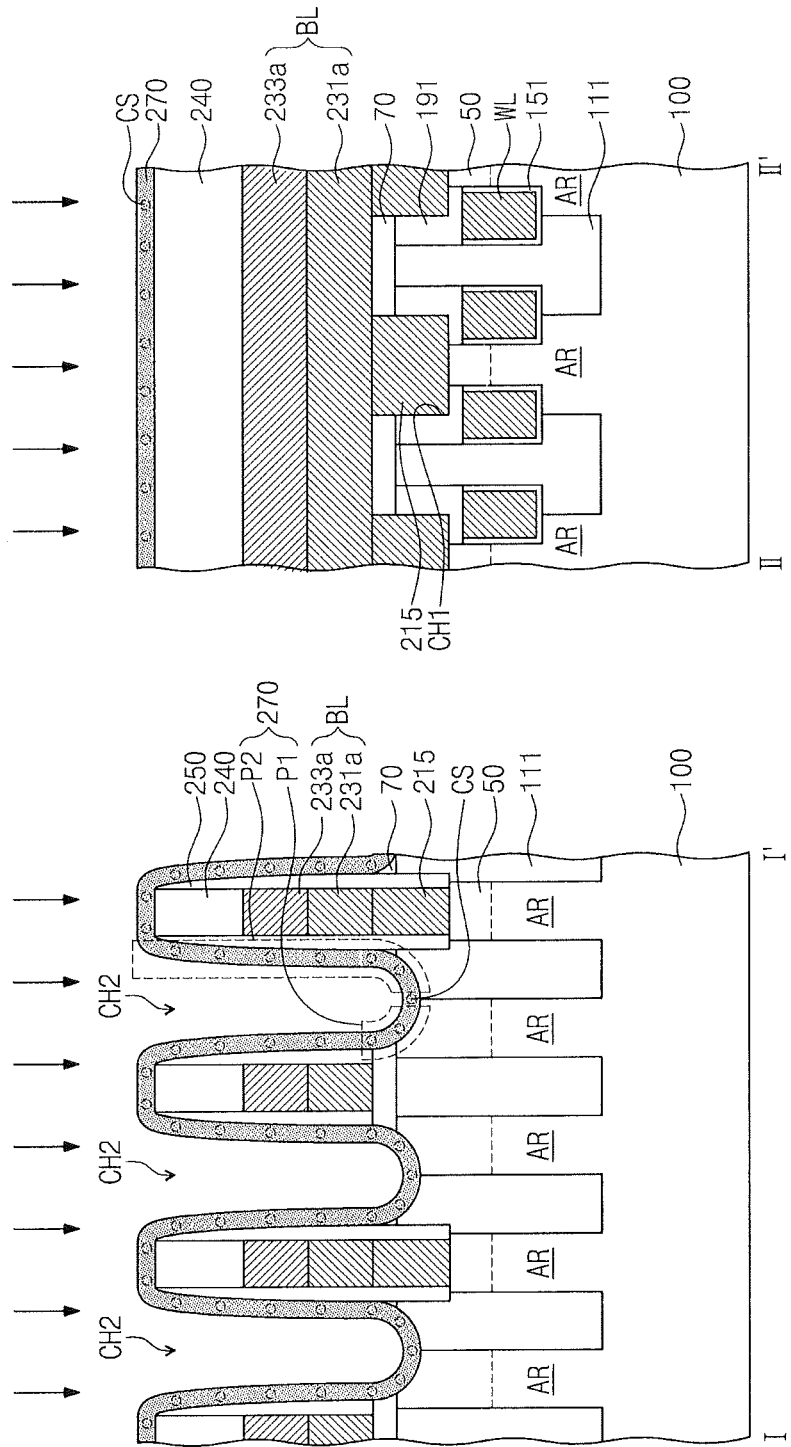

Referring to FIGS. 13A and 13B, a first thermal treatment process may be performed on the amorphous silicon layer 270 to weaken bonding strength between silicon atoms of the amorphous silicon layer 270. The first thermal treatment process may be performed in a hydrogen ($H_2$) atmosphere by supplying a hydrogen gas. During the first thermal treatment process, hydrogen atoms may be diffused from a surface of the amorphous silicon layer 270 into the amorphous silicon layer 270, and thus the hydrogen atoms may be combined with dangling bonds of silicon atoms existing in the amorphous silicon layer 270. As a result, activation regions CS may be formed in the amorphous silicon layer 270. The silicon atoms may be combined with the hydrogen atoms in the activation regions CS. The activation regions CS may correspond to a region in which the bonding strength between the silicon atoms is weakened, and/or a region in which the silicon atoms are independently separated from each other since bonds between the silicon atoms are broken. The activation regions CS may be non-uniformly formed in the amorphous silicon layer 270.

Figure 14A:
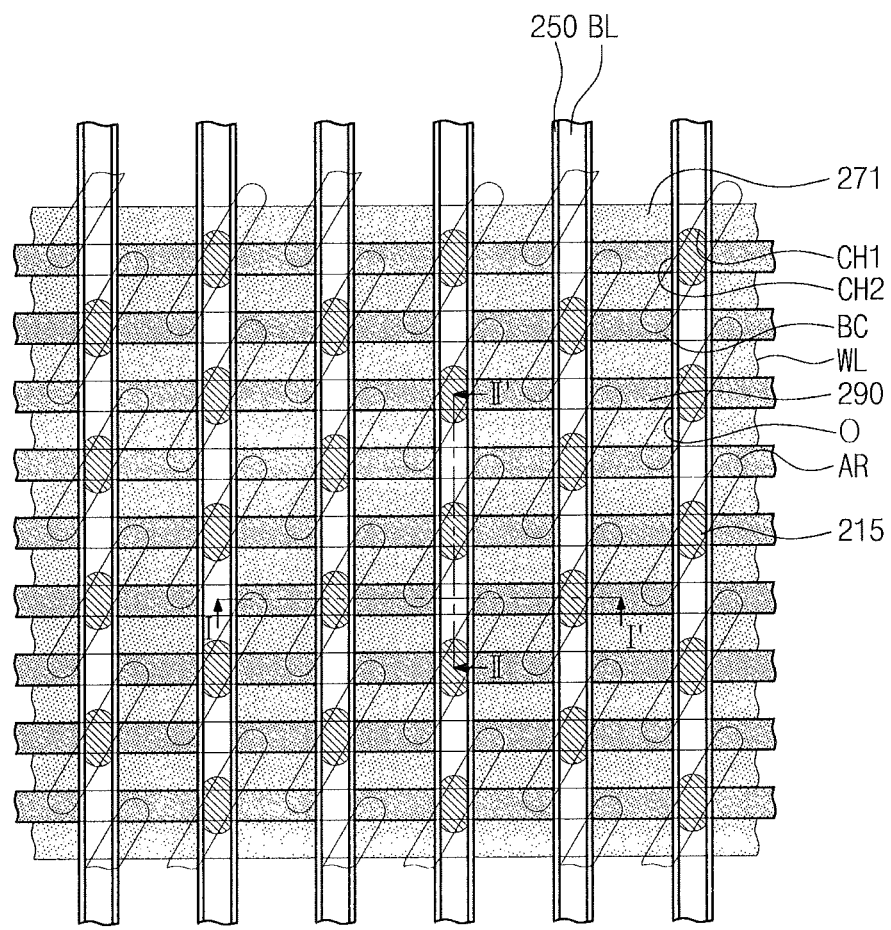
Figure 14A:
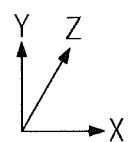
Figure 14B:
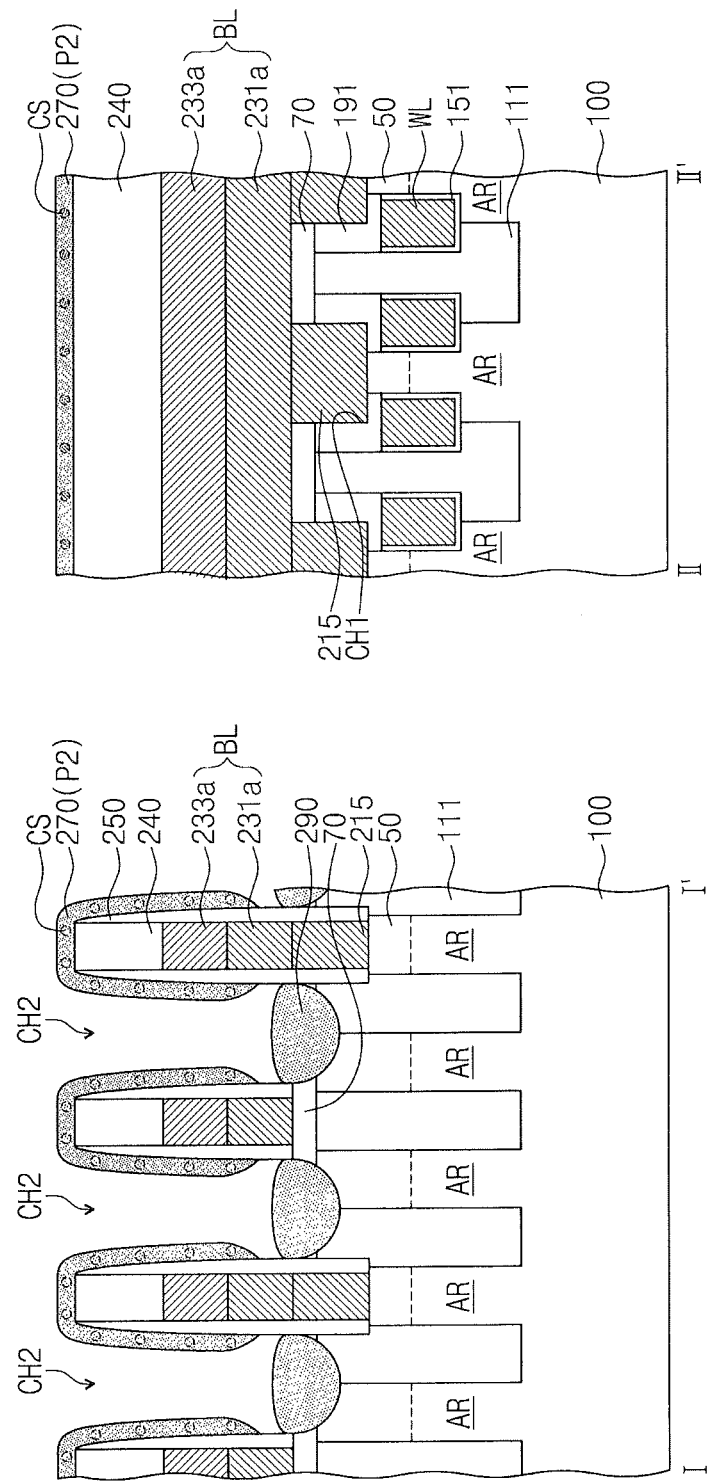

Referring to FIGS. 14A and 14B, the first portions P1 may be crystallized using the substrate 100 as a seed, and the crystallized first portions P1 may be grown to form lower contact plugs 290 respectively filling lower regions of the second contact holes CH2. A second thermal treatment process may be performed on the amorphous silicon layer 270 at a temperature of about 500 degrees Celsius to about 1000 degrees Celsius to crystallize the first portions P1 and to grow the crystallized first portions P1.

Crystallizing the first portions P1 may include rearranging the silicon atoms of the first portions P1 based on a crystal lattice of the substrate 100. In detail, the crystal lattice of the substrate 100 may strongly affect the silicon atoms included in a lower portion of the first portion P1 adjacent to the substrate 100, and thus the silicon atoms of the lower portion of the first portion P1 may be rearranged in the same crystal lattice as the substrate 100. Thus, the lower portion of the first portion P1 may be crystallized to have the same crystal structure (e.g., the same single-crystalline structure) as the substrate 100. The silicon atoms of the activation regions CS may be rearranged by the influence of the silicon atoms rearranged in the same crystal lattice as the substrate 100. Since the bonding strength of the silicon atoms of the activation regions CS are weakened, the silicon atoms of the activation regions CS may be easily rearranged at a low thermal treatment temperature. In other words, the silicon atoms of the activation regions CS may be easily rearranged by low driving force. Grain boundaries defining a grain may be formed in an upper portion of the first portion P1 which is relatively far away from the substrate 100.

A plurality of the crystallized first portions P1 may be grown vertically to the top surface of the substrate 100, and thus the lower contact plugs 290 may be formed. Silicon atoms included in the second portions P2 may be moved to the first portions P1 so as to be used as silicon atoms necessary to grow the first portions P1. For example, the silicon atoms moved to the first portions P1 may be supplied from the activation regions CS formed in the second portions P2. In other words, in some embodiments, the lower contact plugs 290 may be formed by a source-free epitaxial process that does not use a silicon source gas.

The silicon atoms moved to the first portion P1 may be arranged or accumulated on the crystallized first portion P1 to grow the first portion P1. As illustrated in FIG. 2B, a density of the grain boundaries may be lower in a lower portion of the lower contact plug 290 than in an upper portion of the lower contact plug 290. In some embodiments, the grain boundary may not exist in the lower portion of the lower contact plug 290. One or more grain boundaries may exist in the upper portion of the lower contact plug 290. The lower contact plugs 290 may have convex top surfaces. Since the silicon atoms included in the second portion P2 are moved to the first portion P1, the amount of silicon atoms remaining in the second portion P2 may be reduced. Thus, a thickness of a lower portion of the second portion P2 may be thinned. Thus, the lower contact plugs 290 may be separated from the second portions P2.

If lower contact plugs are formed in the lower regions of the second contact holes CH2 having small widths by a deposition process, voids may be formed in the lower contact plugs. The void may cause a contact failure between the lower contact plug and the substrate.

According to some embodiments of the inventive concept, the bonding strength between the silicon atoms of the amorphous silicon layer 270 may be weakened, and the second thermal treatment process may then be performed at a lower temperature to crystallize the first portions P1 of the amorphous silicon layer 270 and to grow the crystallized first portions P1. Thus, the lower contact plugs 290 may be formed to fill the lower regions of the second contact holes CH2. As a result, the lower contact plugs 290 may be formed without a void to prevent a contact failure between the substrate 100 and the lower contact plugs 290.

Figure 15A:
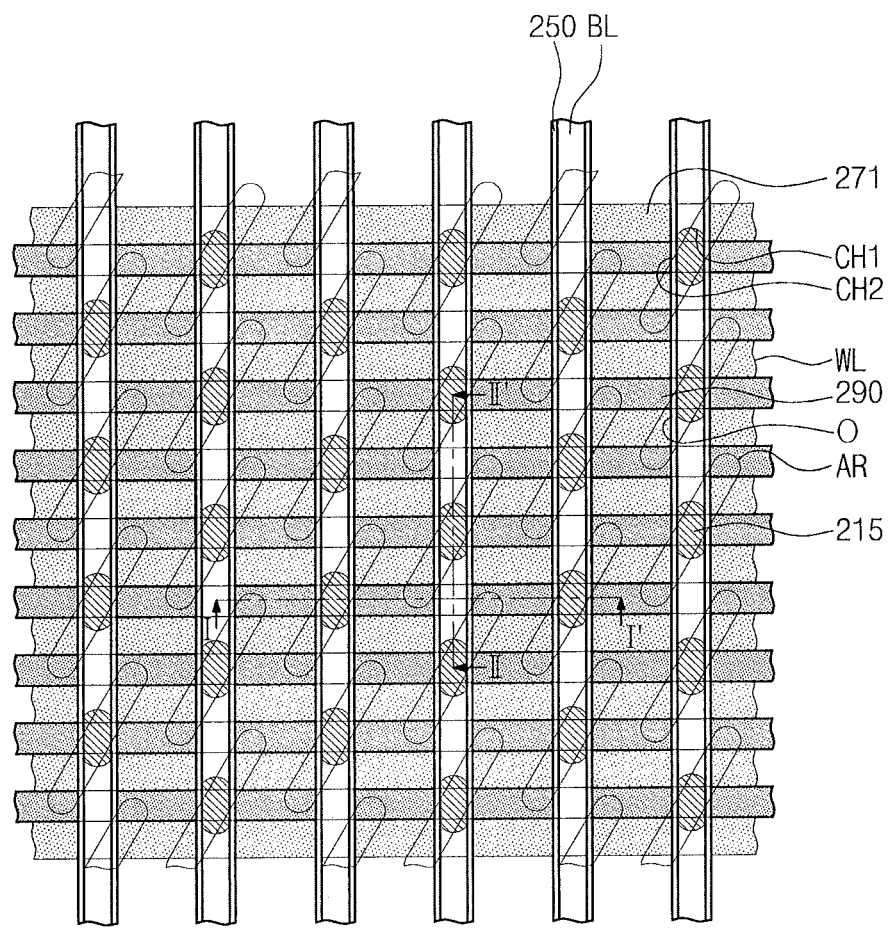
Figure 15A:
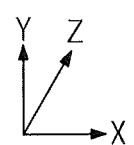
Figure 15B:
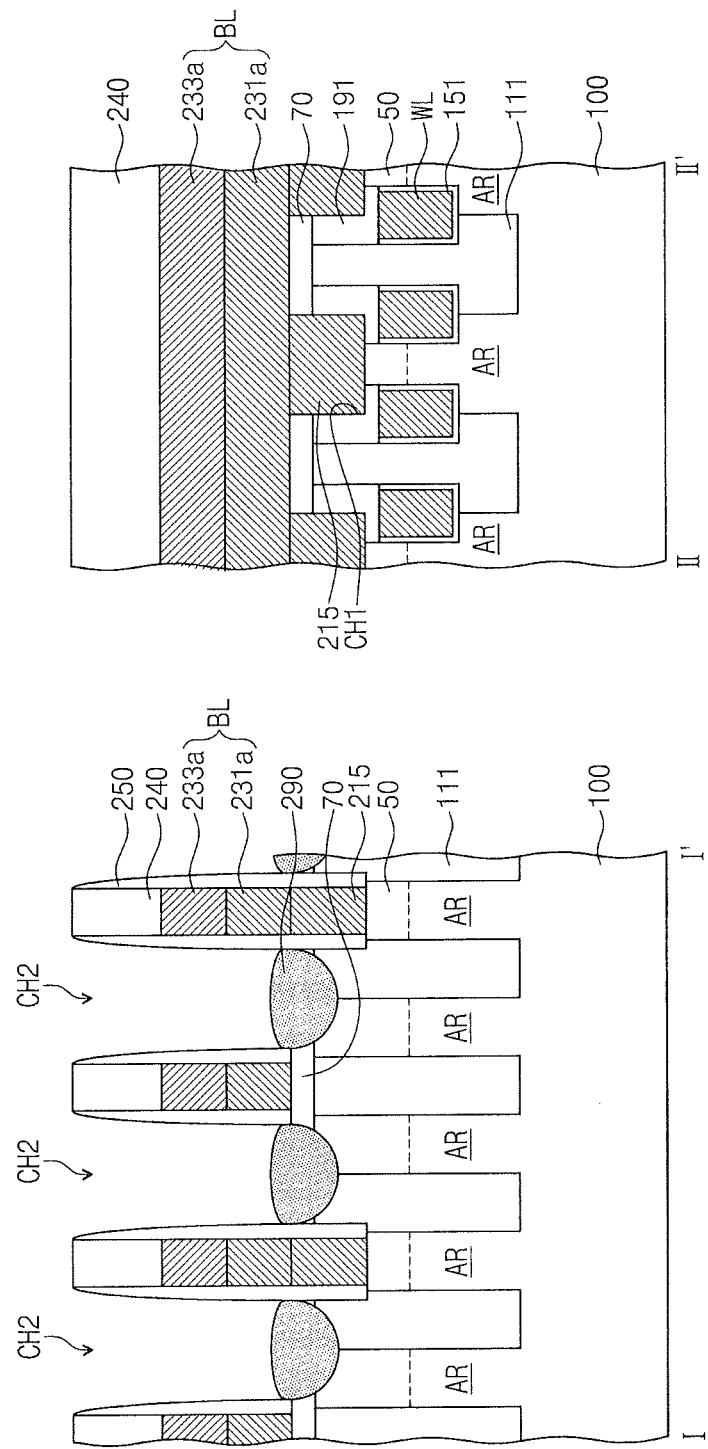

Referring to FIGS. 15A and 15B, an etching process may be performed to remove the second portions P2 remaining on the sidewalls of the spacers 250 and the top surfaces of the insulating patterns 240. The second portions P2 may be removed by a dry etching process. During the etching process, an etch rate of the second portions P2 may be higher than that of the lower contact plugs 290. In other words, an etch rate of the amorphous silicon layer may be higher than that of a poly-silicon layer (i.e., a poly-crystalline silicon layer) in the etching process, and thus the second portions P2 may be selectively removed. The sidewalls of the spacers 250 and the top surfaces of the insulating patterns 240 may be exposed by the removal of the second portions P2.

Figure 16A:
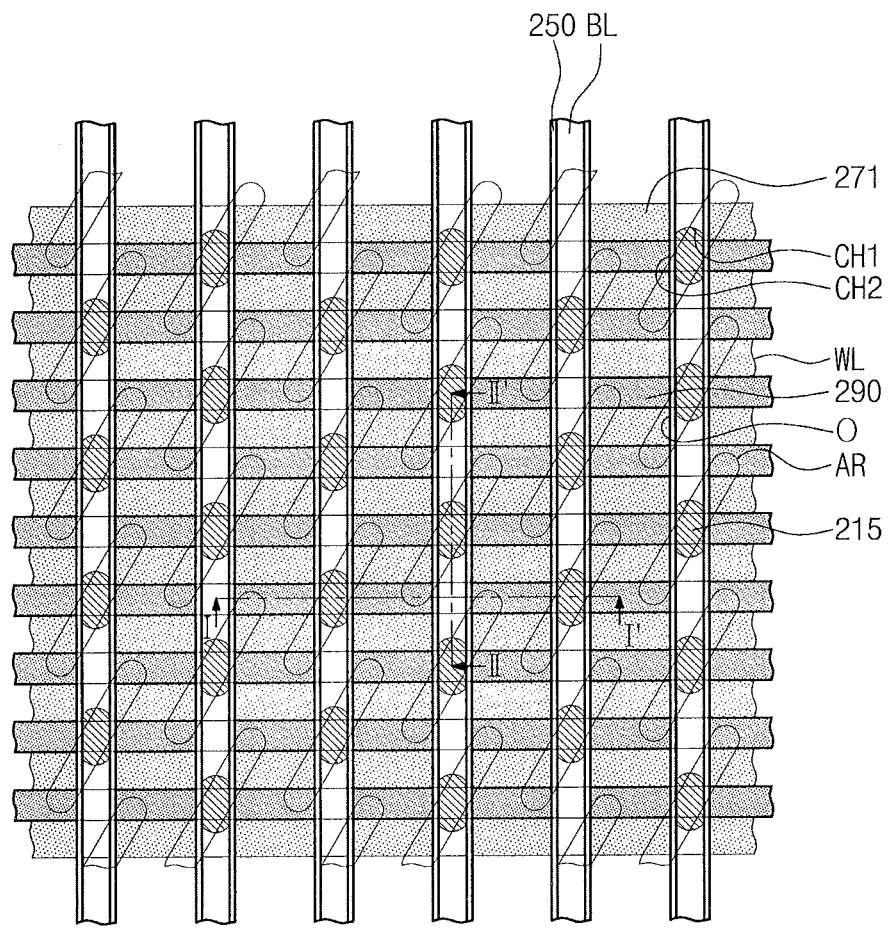
Figure 16A:
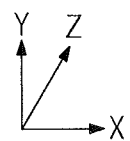
Figure 16B:
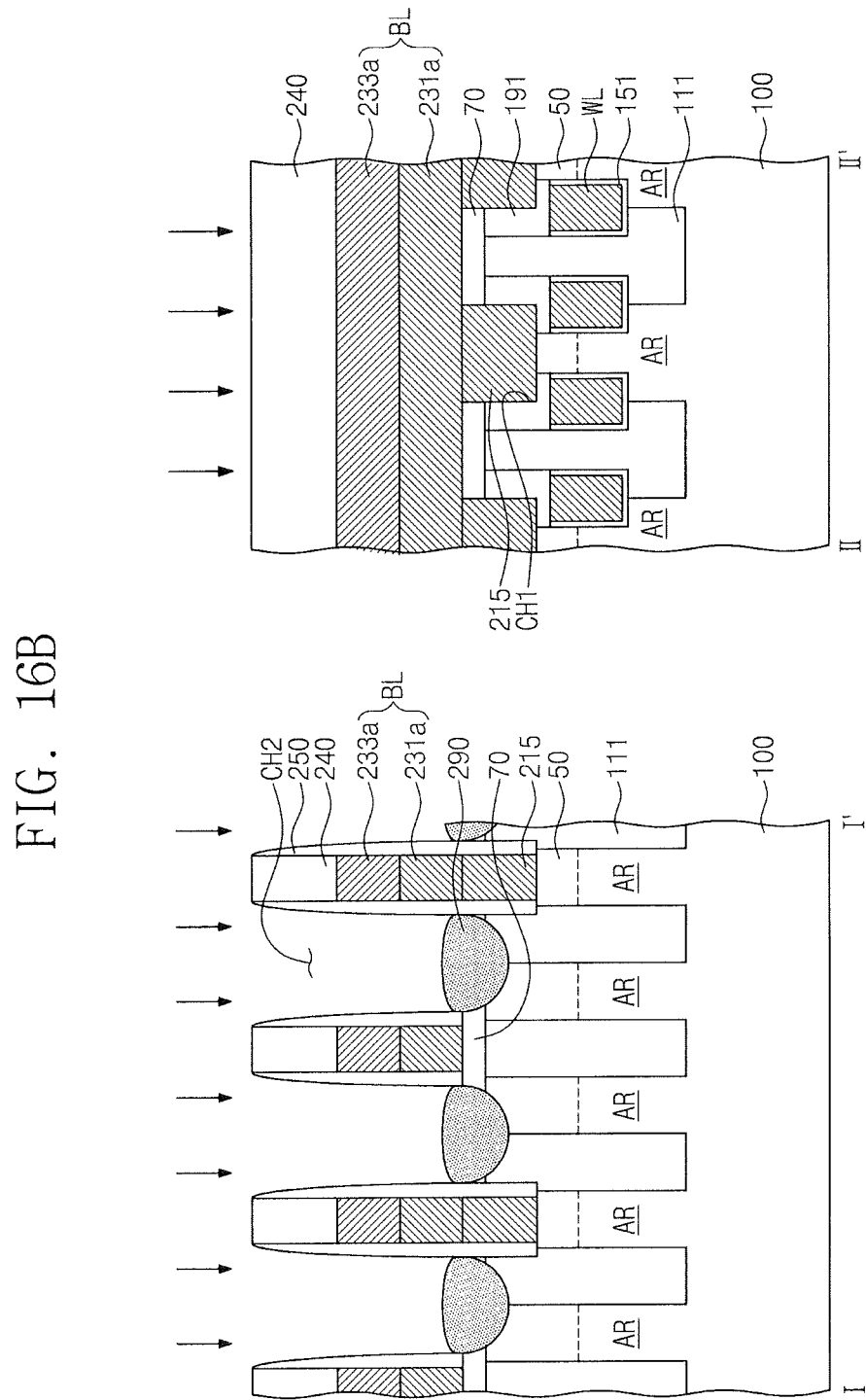

Referring to FIGS. 16A and 16B, the lower contact plugs 290 may be doped with dopants. Doping the lower contact plugs 290 with the dopants may include injecting dopants into the lower contact plugs 290 and activating the dopants in the lower contact plugs 290. The doping process may use a $PH_3$ gas, a $BF_3$ gas, or a $B_2H_6$ gas.

Figure 17A:
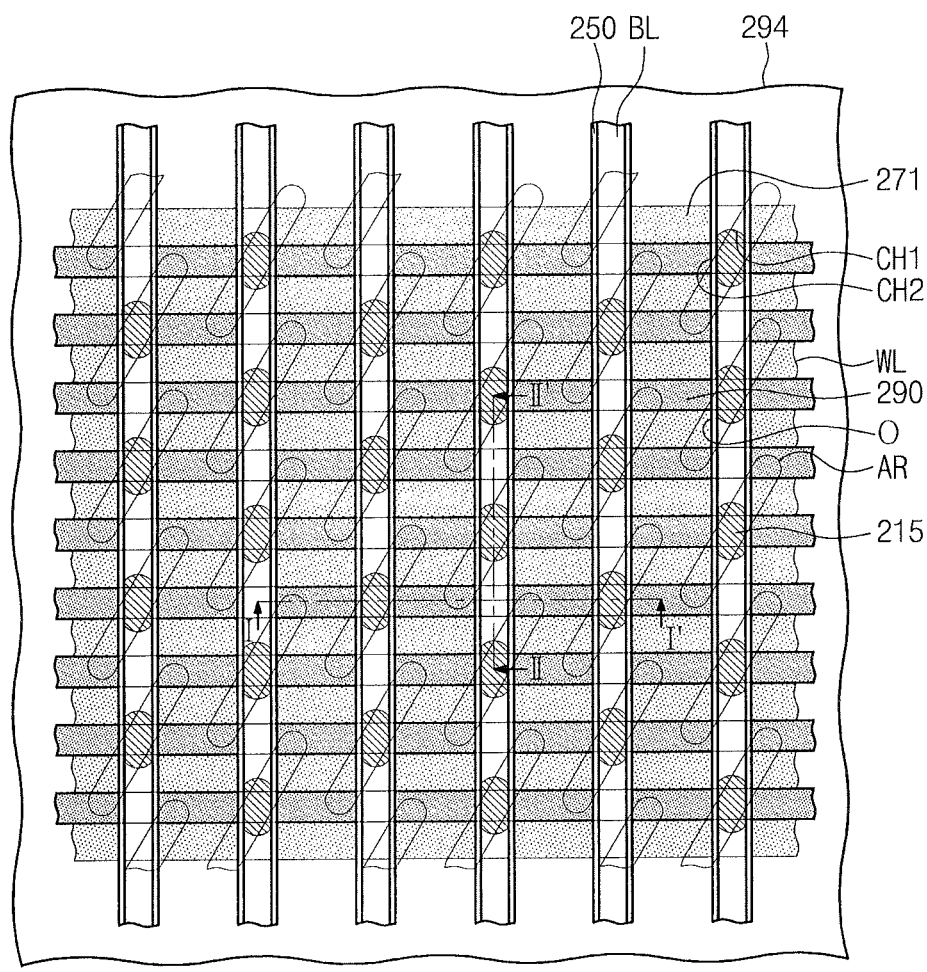
Figure 17B:
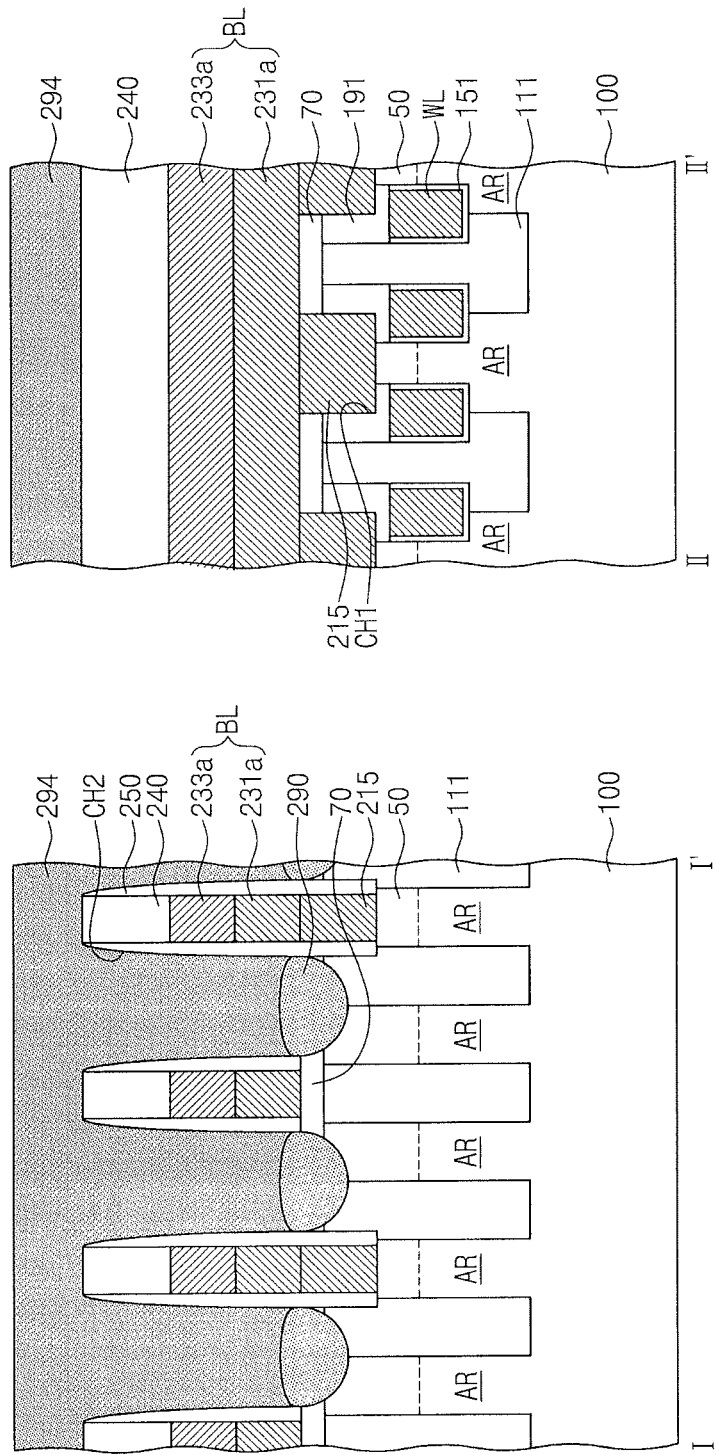

Referring to FIGS. 17A and 17B, a contact layer 294 may be formed on the lower contact plugs 290. The contact layer 294 may fill the second contact holes CH2 and may cover the top surfaces of the insulating patterns 240. The contact layer 294 may be formed using a deposition process such as a chemical vapor deposition (CVD) process, a physical vapor deposition (PVD) process, or an atomic layer deposition (ALD) process. The contact layer 294 may be doped in-situ with dopants during the deposition of the contact layer 294. The contact layer 294 may include a poly-crystalline silicon layer including the dopants (e.g., boron or phosphorus). In some embodiments, a dopant concentration of the contact layer 294 may be lower than a dopant concentration of the lower contact plugs 290.

Figure 18A:
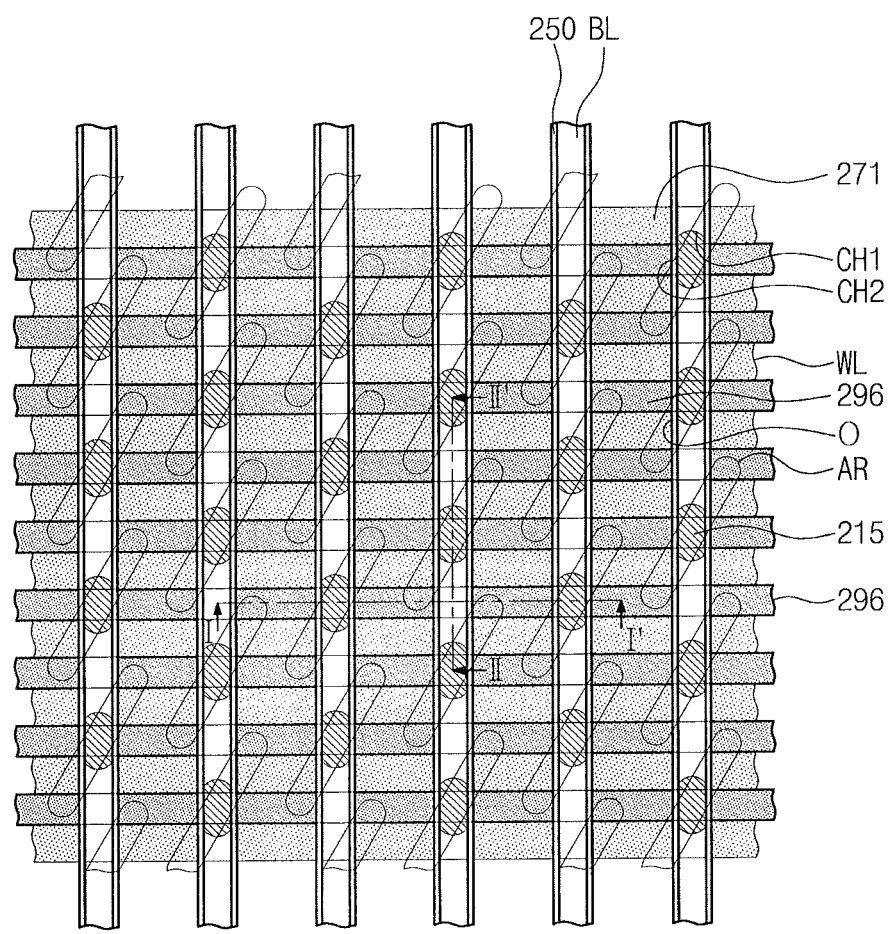
Figure 18B:
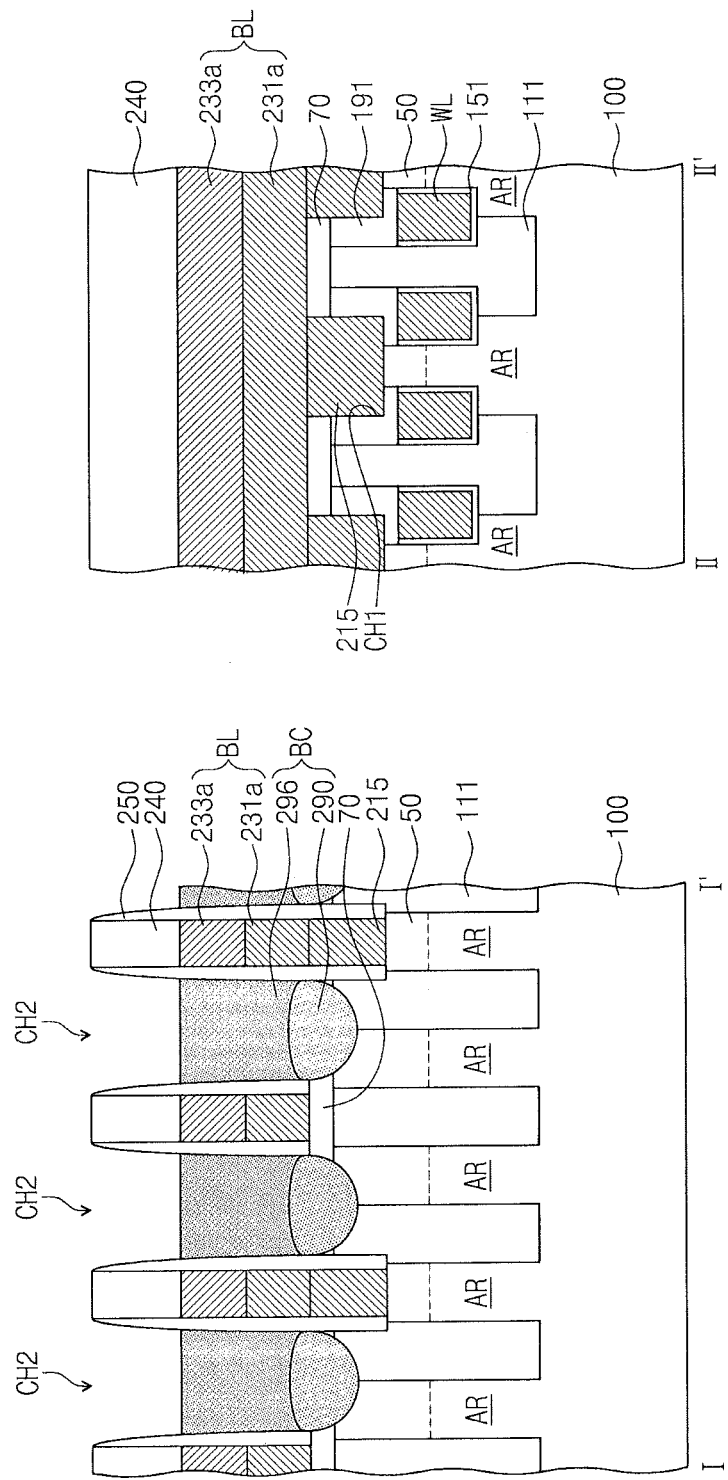

Referring to FIGS. 18A and 18B, an etching process may be performed on the contact layer 294 to form upper contact plugs 296 on the lower contact plugs 290, respectively. The upper contact plugs 296 may be formed to partially fill upper regions of the second contact holes CH2 by performing the etching process (e.g., an etch-back process) on the contact layer 294. Upper portions of the spacers 250 may be exposed by the upper contact plugs 296. The upper contact plugs 296 may include poly-crystalline silicon. In some embodiments, as illustrated in FIG. 2B, an average grain size of the upper contact plug 296 may be smaller than an average grain size of the lower contact plug 290.

Figure 19A:
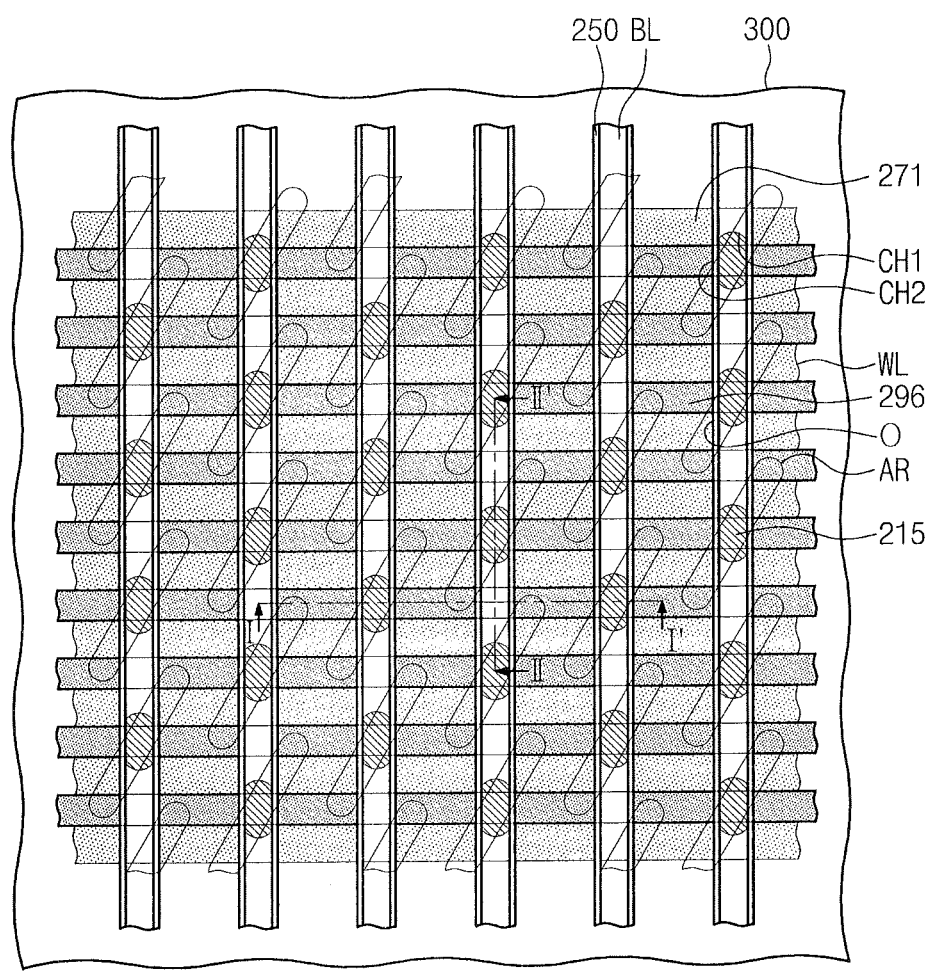
Figure 19B:
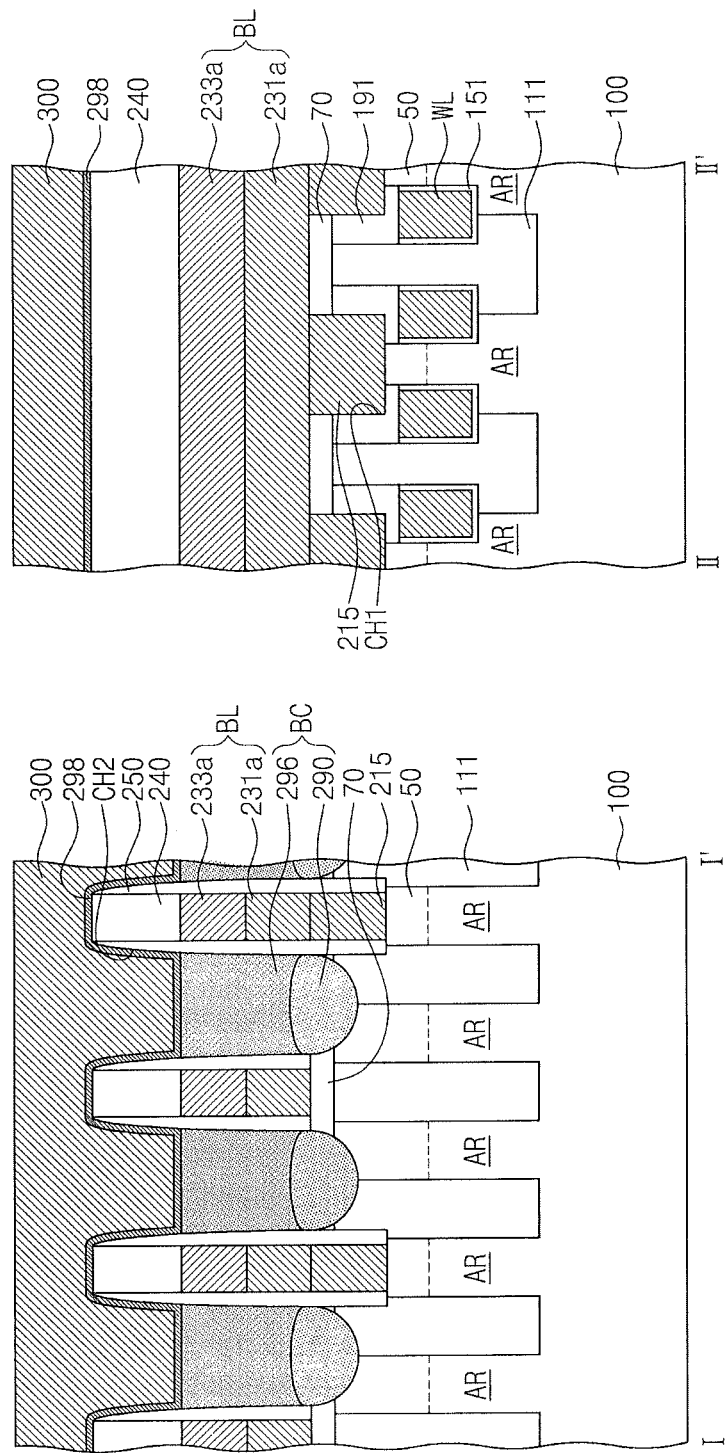

Referring to FIGS. 19A and 19B, a barrier layer 298 may be formed on the upper contact plugs 296. The barrier layer 298 may conformally cover top surfaces of the upper contact plugs 296, the upper portions of the spacers 250, and the top surfaces of the insulating patterns 240. For example, the barrier layer 298 may include a metal nitride layer such as a TiN layer, a TaN layer, or a WN layer. A metal layer 300 may be formed on the barrier layer 298. The metal layer 300 may cover the barrier layer 298 and may fill upper regions of the second contact holes CH2, which are surrounded by the barrier layer 298. For example, the metal layer 300 may include tungsten (W).

Figure 20A:
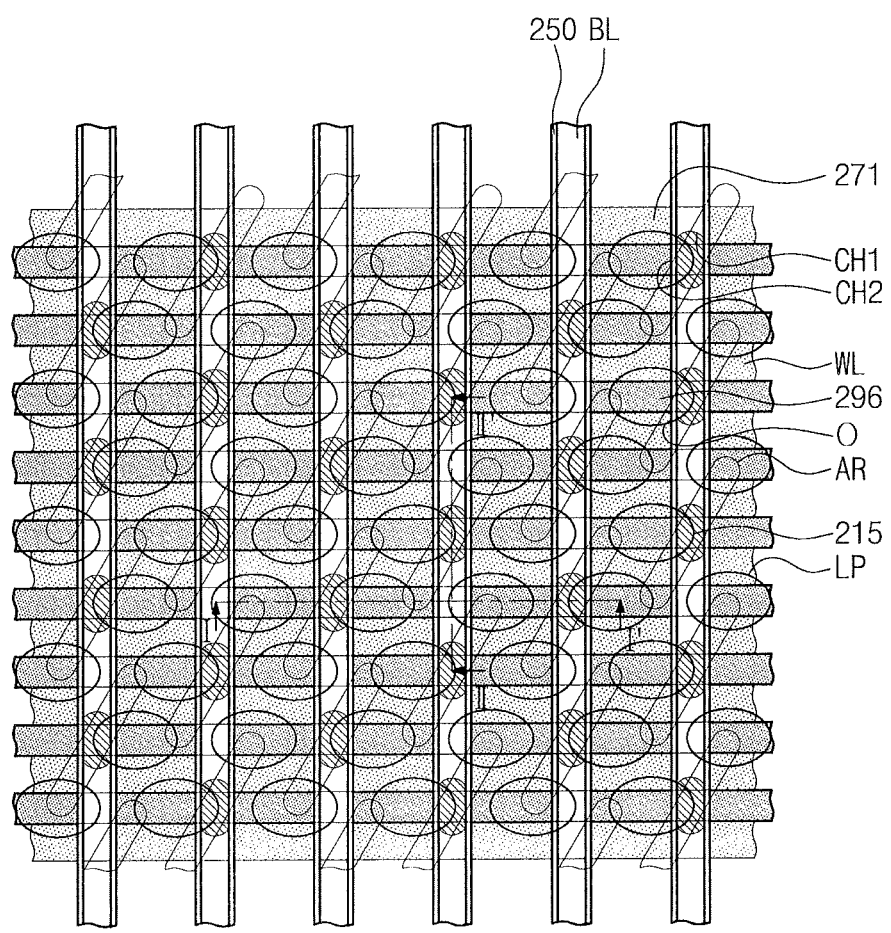
Figure 20B:
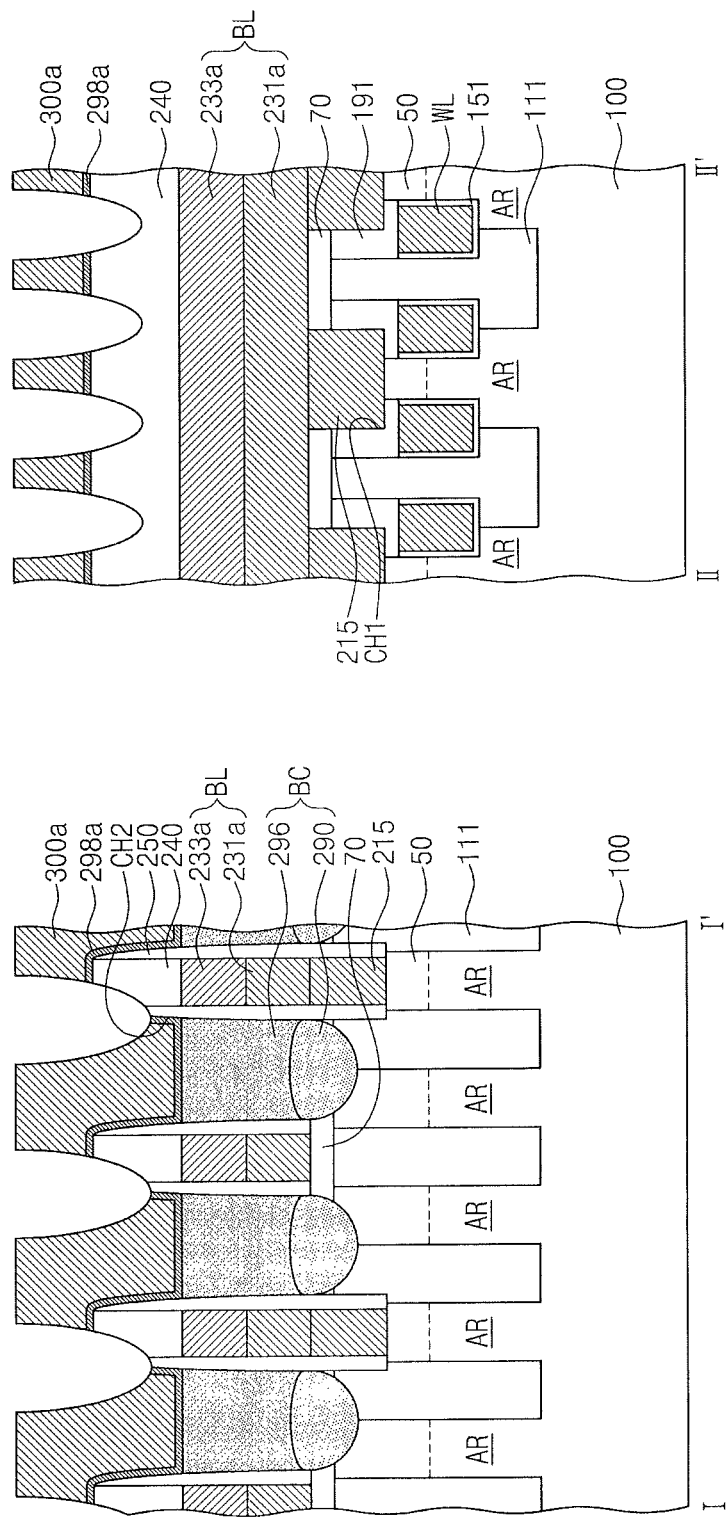

Referring to FIGS. 20A and 20B, the metal layer 300 and the barrier layer 298 may be patterned to form landing pads 300a and barrier patterns 298a. For example, a mask pattern may be formed on the metal layer 300, and the metal layer 300 and the barrier layer 298 may be etched using the mask pattern as an etch mask to form the landing pads 300a and the barrier patterns 298a. The metal layer 300 and the barrier layer 298 may be etched by a dry etching process. The landing pads 300a and the barrier patterns 298a may be formed on the end portions of the active regions AR, respectively.

Referring again to FIGS. 1 and 2A, a gap-fill pattern 310 may be formed to fill a space between the landing pads 300a. In some embodiments, an insulating layer may be formed on the landing pads 300a to fill the space, and a planarization process may be performed on the insulating layer until the landing pads 300a are exposed, thereby forming the gap-fill pattern 310. A top surface of the gap-fill pattern 310 may be disposed at the same level as top surfaces of the landing pads 300a. Data storage elements may be formed on the landing pads 300a. For example, the data storage elements may be capacitors. Forming the data storage elements may include forming bottom electrodes BE on the landing pads 300a, respectively, and forming a dielectric layer (not shown) and a top electrode (not shown) on the bottom electrodes BE.

According to some embodiments of the inventive concept, the bonding strength between the silicon atoms of the amorphous silicon layer may be weakened, and then, the lower contact plug filling the lower region of the contact hole may be formed by crystallizing a portion of the amorphous silicon layer adjacent to the substrate at a low temperature and by growing the crystallized portion at the low temperature. As a result, a void may not be formed in the lower contact plug, thereby preventing the contact failure between the lower contact plug and the substrate.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of fabricating a semiconductor device, the method comprising:
   forming a contact hole that penetrates an interlayer insulating structure disposed on a substrate to expose the substrate;
   forming an amorphous silicon layer including a first portion and a second portion, the first portion covering a top surface of the substrate exposed by the contact hole, and the second portion covering a sidewall of the contact hole;

providing hydrogen atoms into the amorphous silicon layer;

crystallizing the first portion using the substrate as a seed; and forming a lower contact plug filling a lower region of the contact hole by growing the crystallized first portion, wherein the lower contact plug has a convex top surface.

2. The method of claim 1, wherein providing the hydrogen atoms comprises performing a thermal treatment process on the amorphous silicon layer in a hydrogen ($H_2$) atmosphere to combine the hydrogen atoms with silicon atoms of the amorphous silicon layer.

3. The method of claim 1, further comprising forming the interlayer insulating structure, the method of forming the interlayer insulating structure comprising:

forming line patterns on the substrate; and forming an interlayer insulating layer between the line-patterns, wherein forming the contact hole comprises patterning the interlayer insulating layer.

4. The method of claim 1, wherein forming the lower contact plug comprises using silicon atoms included in the second portion as a silicon source.

5. The method of claim 1, further comprising removing the second portion after forming the lower contact plug.

6. The method of claim 1 further comprising forming an upper contact plug on the lower contact plug in an upper region of the contact hole, wherein the upper contact plug includes poly-crystalline-silicon, and wherein an average grain size of the lower contact plug is greater than an average grain size of the upper contact plug.

7. The method of claim 1, further comprising forming an upper contact plug on the lower contact plug in an upper region of the contact hole, wherein the lower contact plug and the upper contact plug include grain boundaries, and wherein a density of the grain boundaries of the lower contact plug is a lower density than a density of the grain boundaries of the upper contact plug.

8. The method of claim 1, wherein the lower contact plug includes grain boundaries, and wherein a density of the grain boundaries existing in a lower portion of the lower contact plug is a lower density than a density of the grain boundaries existing in an upper portion of the lower contact plug.

9. The method of claim 1, wherein the lower contact plug includes grain boundaries in an upper portion of the lower contact plug but does not include grain boundaries in a lower portion of the lower contact plug.

10. The method of claim 1, further comprising doping the lower contact plug with at least-one dopant, wherein doping the lower contact plug comprises injecting the at least one dopant into the lower contact plug; and activating the at least one dopant in the lower contact plug.

11. The method of claim 1, wherein crystallizing the first portion comprises performing a thermal treatment process on the amorphous silicon layer at a temperature in a range from 500 degrees Celsius to 1000 degrees Celsius.

12. The method of claim 1, further comprising forming a data storage element electrically connected to the lower contact plug on the substrate.

13. A method of fabricating a semiconductor device, the method comprising:

forming a contact-hole that penetrates an interlayer insulating structure disposed on a substrate to expose the substrate;

forming an amorphous silicon layer covering a sidewall of the contact hole and a top surface of the substrate exposed by the contact hole;

performing a thermal treatment process on the amorphous silicon layer;

forming a lower contact plug filling a lower region of the contact hole by crystallizing a portion of the amorphous silicon layer, covering the top surface of the substrate, using the substrate as a seed and growing the crystallized portion; and forming an upper contact plug on the lower contact plug in an upper region of the contact hole, wherein an average grain size of the lower contact plug is greater than an average grain size of the upper contact plug.

14. The method of claim 13, wherein the thermal treatment process is performed in a hydrogen ($H_2$) atmosphere, and wherein performing the thermal treatment process comprises combining hydrogen atoms with silicon atoms of the amorphous silicon layer.

15. The method of claim 13, wherein the lower contact plug includes grain boundaries, and wherein a density of the grain boundaries existing in a lower portion of the lower contact plug is a lower density than a density of the grain boundaries existing in an upper portion of the lower contact plug.

16. A method of fabricating a semiconductor device, the method comprising:

forming a contact hole that penetrates an interlayer insulating structure disposed on a substrate to expose the substrate;

forming an amorphous silicon layer covering a sidewall of the contact hole and a top surface of the substrate exposed by the contact hole;

performing a thermal treatment process on the amorphous silicon layer in a hydrogen ($H_2$) atmosphere;

forming a lower contact plug having a convex top surface filling a lower region of the contact hole by crystallizing a portion of the amorphous silicon layer, covering the top surface of the substrate, using the substrate as a seed and growing the crystallized portion; and forming an upper contact plug including poly-crystalline silicon on the lower contact plug in an upper region of the contact hole, wherein an average grain size of the lower contact plug is greater than an average grain size of the upper contact plug.

17. The method of claim 16, wherein the lower contact plug includes grain boundaries, and wherein a density of the grain boundaries existing in a lower portion of the lower contact plug is a lower density than a density of the grain boundaries existing in an upper portion of the lower contact plug.

18. The method of claim 16, wherein the lower contact plug includes grain boundaries in an upper portion of the lower contact plug but does not include grain boundaries in a lower portion of the lower contact plug.

* * * * *